United States Patent
Kawahito et al.

(10) Patent No.: US 8,692,701 B2
(45) Date of Patent: Apr. 8, 2014

(54) PIPELINED A/D CONVERTER CIRCUIT PROVIDED WITH A/D CONVERTER CIRCUIT PARTS OF STAGES EACH INCLUDING PRECHARGE CIRCUIT

(75) Inventors: Shoji Kawahito, Hamamatsu (JP); Sung Wook Jung, Hamamatsu (JP); Osamu Kobayashi, Yokohama (JP); Yasuhide Shimizu, Yokohama (JP); Takahiro Miki, Kawasaki (JP); Takashi Morie, Kadoma (JP); Hirotomo Ishii, Tokyo (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 13/599,195

(22) Filed: Aug. 30, 2012

(65) Prior Publication Data

US 2013/0057418 A1    Mar. 7, 2013

(30) Foreign Application Priority Data

Sep. 2, 2011    (JP) .................................. 2011-191979

(51) Int. Cl.
    *H03M 1/38*    (2006.01)
(52) U.S. Cl.
    USPC ............................ 341/161; 341/155; 341/144
(58) Field of Classification Search
    USPC ................... 341/161, 172, 122, 144, 155, 162
    See application file for complete search history.

(56) References Cited

U.S. PATENT DOCUMENTS

| | | | |
|---|---|---|---|
| 7,612,700 B2 | 11/2009 | Kawahito et al. | |
| 7,821,436 B2 * | 10/2010 | Teeka Srinvasa Setty et al. | 341/121 |
| 8,362,939 B2 * | 1/2013 | Buter et al. | 341/161 |
| 2009/0295609 A1 * | 12/2009 | Venkatesh et al. | 341/122 |
| 2012/0162000 A1 * | 6/2012 | Gotoh | 341/172 |
| 2012/0169520 A1 | 7/2012 | Furuta et al. | |
| 2012/0268304 A1 * | 10/2012 | Lin et al. | 341/172 |

FOREIGN PATENT DOCUMENTS

| | | |
|---|---|---|
| JP | 2009-141861 | 6/2009 |
| WO | 2011/036697 | 3/2011 |

* cited by examiner

*Primary Examiner* — Peguy Jean Pierre
(74) *Attorney, Agent, or Firm* — Wenderoth, Lind & Ponack, L.L.P.

(57) ABSTRACT

A pipelined A/D converter circuit includes a sample hold circuit configured to sample and hold an analog input signal, and output a sample hold signal, and an A/D converter circuit including A/D converter circuit parts connected to each other in cascade, and performs A/D conversion in a pipelined form. The pipelined A/D converter circuit part of each stage includes a sub-A/D converter circuit, a multiplier D/A converter circuit, and a precharge circuit. The sub-A/D converter circuit includes comparators, and A/D convert the input signal into a digital signal of predetermined bits, a multiplier D/A converter circuit for D/A converting the digital signal from the sub-A/D converter circuit into an analog control signal generated with a reference voltage served as a reference value, sample, hold and amplify the input signal by sampling capacitors based on the analog control signal.

4 Claims, 19 Drawing Sheets

| INPUT RANGE | $D_i$ | $DP_i$ |
|---|---|---|
| $-3 \cdot V_r / 4 \leq V_{IN} < -V_r / 2$ | -1 | -1 |
| $-V_r / 2 \leq V_{IN} < -V_r / 4$ | -1 | 1 |
| $-V_r / 4 \leq V_{IN} < 0$ | 0 | -1 |
| $0 \leq V_{IN} < V_r / 4$ | 0 | 1 |
| $V_r / 4 \leq V_{IN} < V_r / 2$ | 1 | -1 |
| $V_r / 2 \leq V_{IN} < 3 \cdot V_r / 4$ | 1 | 1 |

(i-1)-TH STAGE SAMPLE PHASE     i-TH STAGE AMPLIFICATION PHASE

AMPLIFICATION PHASE     SAMPLE PHASE

PIPELINED A/D CONVERTER CIRCUIT PROVIDED WITH A/D CONVERTER CIRCUIT PARTS OF STAGES EACH INCLUDING PRECHARGE CIRCUIT

BACKGROUND OF THE INVENTION

1. Field of the Invention

The present invention relates to a pipelined A/D converter circuit, and in particular, to a pipelined A/D converter circuit provided with an A/D converter circuit parts of respective stage each including a sub-A/D converter circuit, a multiplier D/A converter circuit, and a precharge circuit.

2. Description of the Related Art

Conventionally, pipelined A/D converter circuits have been widely used as high-speed high-resolution A/D converter circuits for use in communications, images and so on. The pipelined A/D converter circuits are required to have an increased speed and low power consumption.

FIG. 17 shows a configuration of a conventional pipelined A/D converter circuit. The pipelined A/D converter circuit 910 is configured to include a sample hold circuit 11, and a plurality of A/D converter circuit parts 920-1 to 920-k. The A/D converter circuit parts 920-1 to 920-k are connected to each other in cascade. Moreover, each of the A/D converter circuit parts 920-1 to 920-k functions as a pipeline stage serving as a fundamental operation circuit. In the following description, the A/D converter circuit part 920-i (where "i" is an integer of 1 to k) is referred to as an i-th stage. The A/D converter circuit parts 920-1 to 920-k are each configured to include a sample hold part 21, an ADC 22, a DAC 23, and a residue gain amplifier 24. The sample hold part 21 samples and holds an input signal $V_1$. The ADC 22 converts the analog input signal $V_1$ into an $n_1$-bit digital signal, and outputs the resulting signal. The DAC 23 converts the digital signal converted by the ADC 22 into an analog signal. The residue gain amplifier 24 amplifies a result obtained by subtracting a signal outputted from the DAC 23 from the signal sampled and held by the sample hold part 21, and outputs the resulting signal as an output signal $V_2$. Moreover, the sample hold part 21, the ADC 22, the DAC 23 and the residue gain amplifier 24 are collectively referred to as a multiplier D/A converter circuit (Multiplying Digital to Analog Converter; MDAC).

Referring to FIGS. 18A and 18B, each pipeline stage alternately repeats sample phase operation and amplification phase operation by switchover of the connection of the circuits with a switch in a constant time cycle. That is, as shown in FIG. 18A, when the (i−1)-th stage operates in the sample phase, the i-th stage, or the rear stage operates in the amplification phase. Conversely, as shown in FIG. 18B, when the (i−1)-th stage operates in the amplification phase, the i-th stage operates in the sample phase. The sample phase is the phase in which an input voltage $V_{IN}$ is sampled by charging sampling capacitors $C_1$ and $C_2$ with the input voltage $V_{IN}$. At this time, the bottom plates of the sampling capacitors $C_1$ and $C_2$ are connected to the input voltage $V_{IN}$, and the top plates of the sampling capacitors $C_1$ and $C_2$ are connected to a reference potential GND and connected to the inverted input of an operational amplifier A. The amplification phase is the phase in which the voltages sampled by $C_1$ and $C_2$ in the sampling phase are amplified and outputted to the rear stage. More concretely, by connecting an output of the DAC 23 with the bottom plate of $C_1$, connecting the bottom plate of $C_2$ with an output of the operational amplifier A, and disconnecting the top plates of $C_1$ and $C_2$ from the reference potential GND, $V_{OUT}$ that ideally satisfies $V_{OUT}=-V_{DAC}+2V_{IN}$ is outputted to the rear stage. As an example of such a pipelined A/D converter circuit, there is the pipelined A/D converter circuit described in the Patent Document 1.

A prior art document related to the present invention is Patent Document 1 of Japanese patent laid-open publication No. JP 2009-141861 A.

In the pipelined A/D converter circuit described above, the i-th stage operates in the sample phase when the (i−1)-th stage is in the amplification phase as shown in FIG. 18B. Therefore, when the (i−1)-th stage is switched over to the amplification phase and the i-th stage is switched over to the sample phase, an operational amplifier A(i−1) charges the sampling capacitors $C_1'$ and $C_2'$ of the i-th stage up to a voltage corresponding to a predetermined operation result. At this time, the time required for charging fluctuates due to electric charges accumulated in $C_1'$ and $C_2'$ before the i-th stage is switched over to the sample phase. The larger the difference between the accumulated electric charges and the target electric charges after the charging, the more a settling time consumed until the charging is completed. Although a bias current flowed to the operational amplifier A needs to be increased in order to improve the sampling rate of the pipelined A/D converter circuit by performing charging in a short time, the power consumption disadvantageously increases in this case.

In this case, when the charging time is insufficient, a settling error is generated which is an error between the actual voltage value and the target voltage value at the time of ending the charging. FIG. 19 shows characteristics of the settling error in a general pipelined A/D converter circuit. In this case, Vr is a reference voltage outputted from the DAC 23. As shown in FIG. 19, the settling error Est becomes non-linear to the input voltage Vin.

The reason why the settling error becomes non-linear to the input voltage Vin is as follows. The operational amplifier A operates so as to reduce an input potential difference that is a potential difference between a positive input and a negative input in the amplification phase. In this case, the input potential difference is large at the time of starting charging, and the operational amplifier A operates in a slewing region in which the output current becomes constant not depending on the input potential difference. On the other hand, the input potential difference becomes small as the charging progresses, and the operational amplifier A operates in a transconductance region in which the output current is proportional to the input potential difference. Since the operations in the two regions are combined together as described above, the settling error becomes non-linear to the input voltage Vin.

Since a complicated circuit configuration is required for correcting the non-linear settling error as shown in FIG. 19, the settling error should be preferably linear to the input voltage Vin. As a method of linearizing the settling error, there is the method of using an operational amplifier that does not operate in the slewing region but operates only in a transconductance drive region in a manner similar to that of the Patent Document 1. However, this method has such a problem that PSRR deteriorates because of no constant current source provided for the operational amplifier A.

SUMMARY OF THE INVENTION

An object of the present invention is to solve the aforementioned problems and provide a pipelined A/D converter circuit capable of linearizing the settling error and operating at high speed with small power consumption.

In order to achieve the aforementioned objective, according to one aspect of the present invention, there is provided a pipelined A/D converter circuit including a sample hold circuit, and an A/D converter circuit. The sample hold circuit is configured to sample and hold an analog input signal, and thereafter, output a sample hold signal, and an A/D converter circuit is configured to include a plurality of A/D converter circuit parts that are connected to each other in cascade, and performs A/D conversion in a pipelined form. The pipelined A/D converter circuit part of each stage includes a sub-A/D converter circuit, a multiplier D/A converter circuit, and a precharge circuit. The sub-A/D converter circuit is configured to include a plurality of comparators, and A/D convert the input signal into a digital signal of predetermined bits. The multiplier D/A converter circuit is configured to D/A convert the digital signal from the sub-A/D converter circuit into an analog control signal generated with a reference voltage served as a reference value, sample, hold and amplify the input signal by means of the plurality of sampling capacitors based on the analog control signal. The precharge circuit is configured to charge the sampling capacitor on a rear stage side with an intermediate voltage value between an upper limit and a lower limit of the reference voltage in accordance with comparison result signals outputted from the plurality of comparators included in the sub-A/D converter circuit before the sampling is performed in the multiplier D/A converter circuit on the rear stage side.

According to the pipelined A/D converter circuit as described above, the precharge circuit performs charging with the intermediate voltage value between the upper limit and the lower limit of the positive reference voltage before sampling the input signal in the sampling capacitors. Therefore, the settling error can be linearized with a simple circuit configuration, and a high-speed pipelined A/D converter circuit of small power consumption can be obtained.

In the above-mentioned pipelined A/D converter circuit, the precharge circuit includes first and second control switches. The first control switch is configured to connect the plurality of sampling capacitors in series as a plurality of combined capacitances between a positive reference voltage source and a negative reference voltage source. The second control switch is configured to connect the plurality of sampling capacitors in parallel between the positive reference voltage source and the negative value reference voltage source. The charging is performed by connecting in series the plurality of sampling capacitors in series as a plurality of combined capacitances by means of the first control switch between the positive reference voltage source and the negative reference voltage source, and thereafter changing connection of the plurality of sampling capacitors to parallel connection by means of the second control switch.

According to the pipelined A/D converter circuit as described above, by connecting in series the sampling capacitors used for sampling, holding, and amplification as a plurality of combined capacitances between the positive reference voltage source and the negative reference voltage source, and thereafter changing the connection of the plurality of sampling capacitors to the parallel connection by using the second control switch, the capacitors can be also used for generating the voltage for charging. Therefore, no voltage generator circuit needs to be separately provided for charging, and the mounting area of the circuit can be suppressed small.

In addition, in the above-mentioned pipelined A/D converter circuit, the sub-A/D converter circuit, which is included by the A/D converter circuit part of the first stage among the A/D converter circuit parts, is configured to include five comparators having threshold values of $-V_r/2$, $-V_r/4$, 0, $+V_r/4$ and $+V_r/2$, respectively, with a reference value $V_r$ of A/D conversion of each of the A/D converter circuit parts. The sub-A/D converter circuit, which is included by the A/D converter circuit parts of the A/D converter circuit parts of stages other than the first stage among the A/D converter circuit parts, is configured to include three comparators having threshold values of $-V_r/4$, 0 and $+V_r/4$, respectively. The precharge circuit outputs five-value output signals of $-2V_r/3$, $-V_r/3$, 0, $V_r/3$ and $2V_r/3$ based on comparison result signals from the comparators.

According to the pipelined A/D converter circuit as described above, the five-value output signals of $-2V_r/3$, $-V_r/3$, 0, $V_r/3$ and $2V_r/3$ are outputted based on the comparison result signals from the five comparators having threshold values of $-V_r/2$, $-V_r/4$, 0, $+V_r/4$ and $+V_r/2$, respectively, or the three comparators having threshold values of $-V_r/4$, 0 and $+V_r/4$, respectively. Therefore, the intermediate voltage value used for the charging in the precharge circuit is generated in accordance with the input voltage to the A/D converter circuit part, so that the settling error can be made to be more linear, and a high-speed pipelined A/D converter circuit of a small power consumption can be obtained.

Further, in the above-mentioned pipelined A/D converter circuit, each of the sub-A/D converter circuits includes five comparators having threshold values of $-V_r/2$, $-V_r/4$, 0, $+V_r/4$ and $+V_r/2$, respectively, with a reference value $V_r$ of A/D conversion of each of the A/D converter circuit parts. The precharge circuit outputs five-value output signals of $-2V_r/3$, $-V_r/3$, 0, $V_r/3$ and $2V_r/3$ based on comparison result signals from the five comparators.

According to the pipelined A/D converter circuit as described above, the five-value output signals of $-2V_r/3$, $-V_r/3$, 0, $V_r/3$ and $2V_r/3$ are outputted based on the comparison result signals from the five comparators having threshold values of $-V_r/2$, $-V_r/4$, 0, $+V_r/4$ and $+V_r/2$, respectively. Therefore, the intermediate voltage value used for the charging in the precharge circuit is generated in accordance with the input voltage to the A/D converter circuit part, so that the settling error can be made more linear, and a high-speed pipelined A/D converter circuit of a small power consumption can be obtained.

Furthermore, the above-mentioned pipelined A/D converter circuit further includes a digital error correction circuit including error correction circuits of a plurality of stages that are connected to each other in cascade. The error correction circuit of the first stage among the error correction circuits corrects the input signal outputted from the A/D converter circuit parts located in the rear stages of the A/D converter circuit part by using a digital signal outputted from the sub-A/D converter circuit included by the A/D converter circuit part and a comparison result signal outputted from the comparator included in the sub-A/D converter circuit included by the A/D converter circuit part. The error correction circuits of stages other than the first stage among the error correction circuits correct the input signal outputted from the A/D converter circuit part, respectively, by using a digital signal outputted from the sub-A/D converter circuit included by the A/D converter circuit part, a comparison result signal outputted from the comparator included in the sub-A/D converter circuit included by the A/D converter circuit part, and the input signal corrected by the error correction circuits of the other stages.

According to this, the linearized settling error can be corrected by the digital error correction circuit, a high-speed pipelined A/D converter circuit of a small power consumption and high conversion accuracy can be obtained.

According to the present invention, a high-speed pipelined A/D converter circuit, which can linearize the settling error and has small power consumption, can be obtained.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
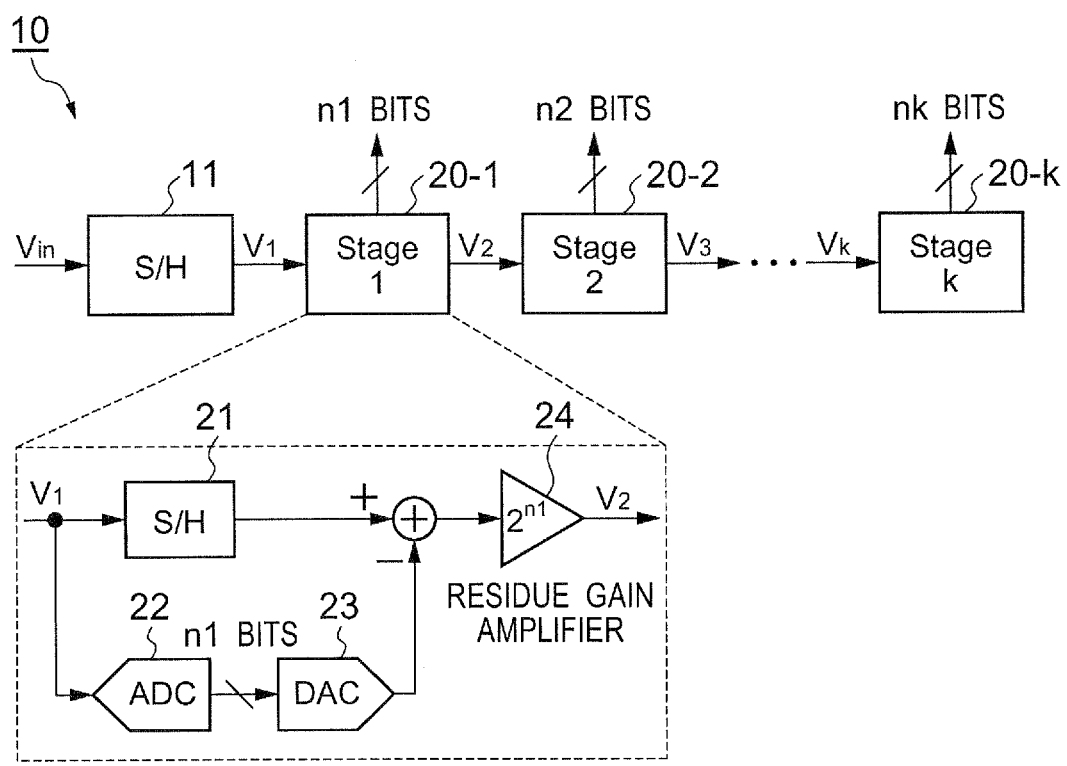
FIG. 1 is a diagram showing a configuration of a pipelined A/D converter circuit according to a present preferred embodiment.

A preferred embodiment of the pipelined A/D converter circuit of the present invention will be described in detail below with reference to the accompanying drawings. It is noted that like components are denoted by like reference numerals in the description of the drawings, and no iterative explanation is provided.

Figure 17:
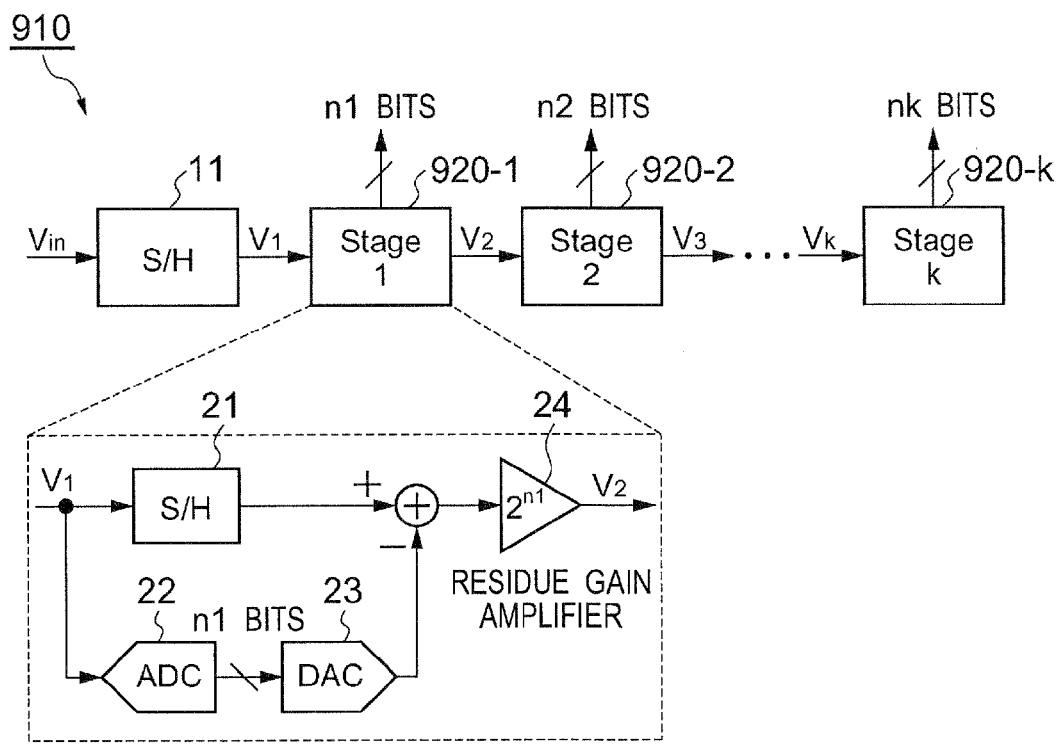
FIG. 17 is a diagram showing a configuration of a conventional pipelined A/D converter circuit.

The pipelined A/D converter circuit of the present preferred embodiment also has a block configuration similar to that of the conventional pipelined A/D converter circuit 10 shown in FIG. 17. That is, as shown in FIG. 1, the pipelined A/D converter circuit 10 of the present preferred embodiment is configured to include a sample hold circuit 11, which samples and holds an analog input signal, and thereafter, outputs a sample hold signal after sampling and holding, and a plurality of A/D converter circuit parts 20-1 to 20-$k$, and the A/D converter circuit parts 20-1 to 20-$k$ are connected to each other in cascade. Differences of the A/D converter circuit parts 20-1 to 20-$k$ of the pipelined A/D converter circuit of the present preferred embodiment from the A/D converter circuit parts 920-1 to 920-$k$ of the conventional pipelined A/D converter circuit are described in detail hereinbelow.

Figure 2A:
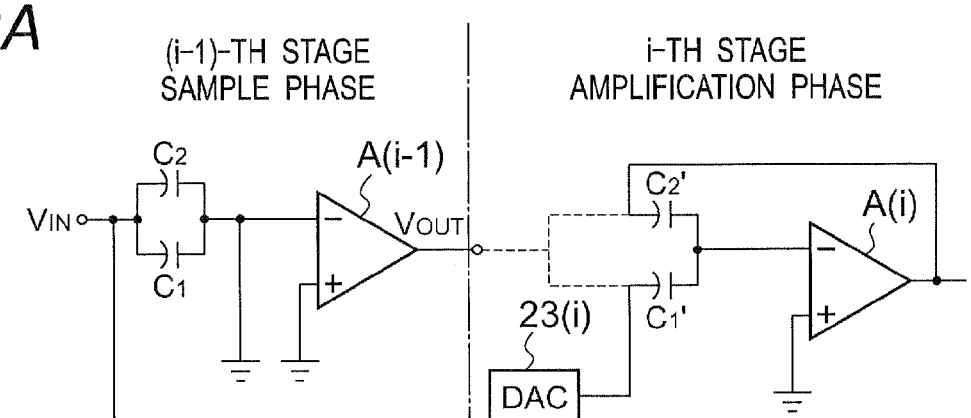
FIGS. 2A, 2B and 2C are diagrams showing a configuration and operation of the pipelined A/D converter circuit of the present preferred embodiment.
Figure 2B:
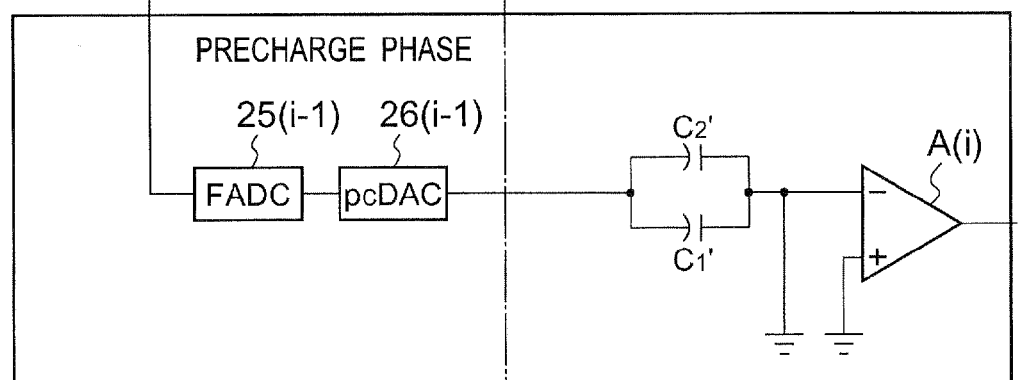
Figure 2C:
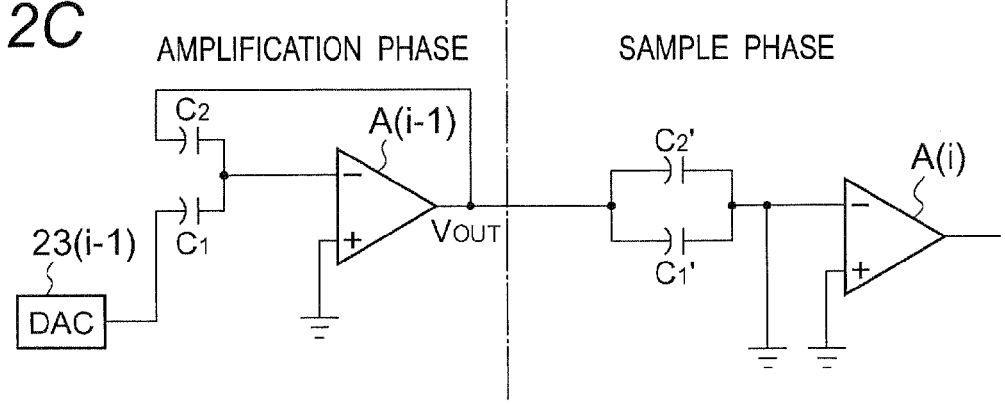
Figure 18A:
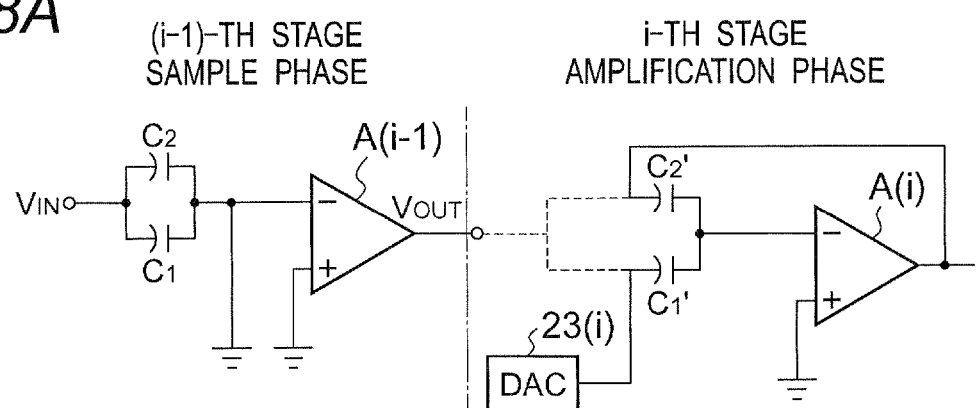
FIGS. 18A and 18B are diagrams showing an operation of the conventional pipelined A/D converter circuit.
Figure 18B:
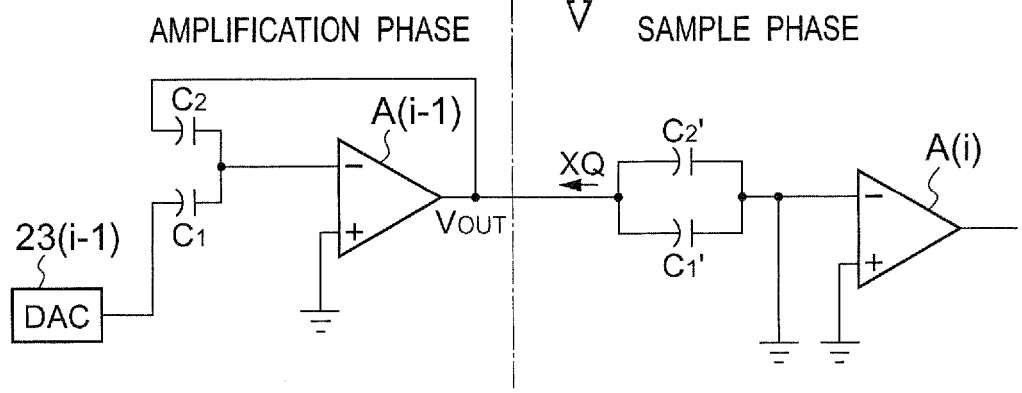

FIGS. 2A, 2B and 2C are diagrams showing a configuration and an operation of the pipelined A/D converter circuit of the present preferred embodiment. In these figures, the (i−1)-th stage and the i-th stage are shown in a manner similar to that of FIGS. 18A and 18B. The (i−1)-th stage is configured to include sampling capacitor $C_1$ and $C_2$, an operational amplifier A(i−1), a DAC 23(i−1), an FADC 25, and a pcDAC 26. The i-th stage is configured to include sampling capacitors $C_1'$ and $C_2'$, an operational amplifier A(i), a DAC 23(i), an FADC 25(i) (not shown), and a pcDAC 26(i) (not shown).

FIG. 2A shows a state in which the (i−1)-th stage operates in the sample phase, and the i-th stage is operating in the amplification phase. With regard to the sample phase and the amplification phase, the pipelined A/D converter circuit of the present preferred embodiment operates in a manner similar to that of the conventional pipelined A/D converter circuit.

Next, FIG. 2B shows a state immediately before a shift of the (i−1)-th stage of the pipelined A/D converter circuit of the present preferred embodiment to the amplification phase, i.e., a state immediately before a shift of the i-th stage to the sample phase. The operation in this state is referred to as precharge operation, and this operation stage is referred to as a precharge phase. In this precharge phase, an input $V_{IN}$ of the (i−1)-th stage is connected to the FADC (sub-A/D converter circuit) 25, and the output of the FADC 25 is inputted to the pcDAC 26.

Figure 3:
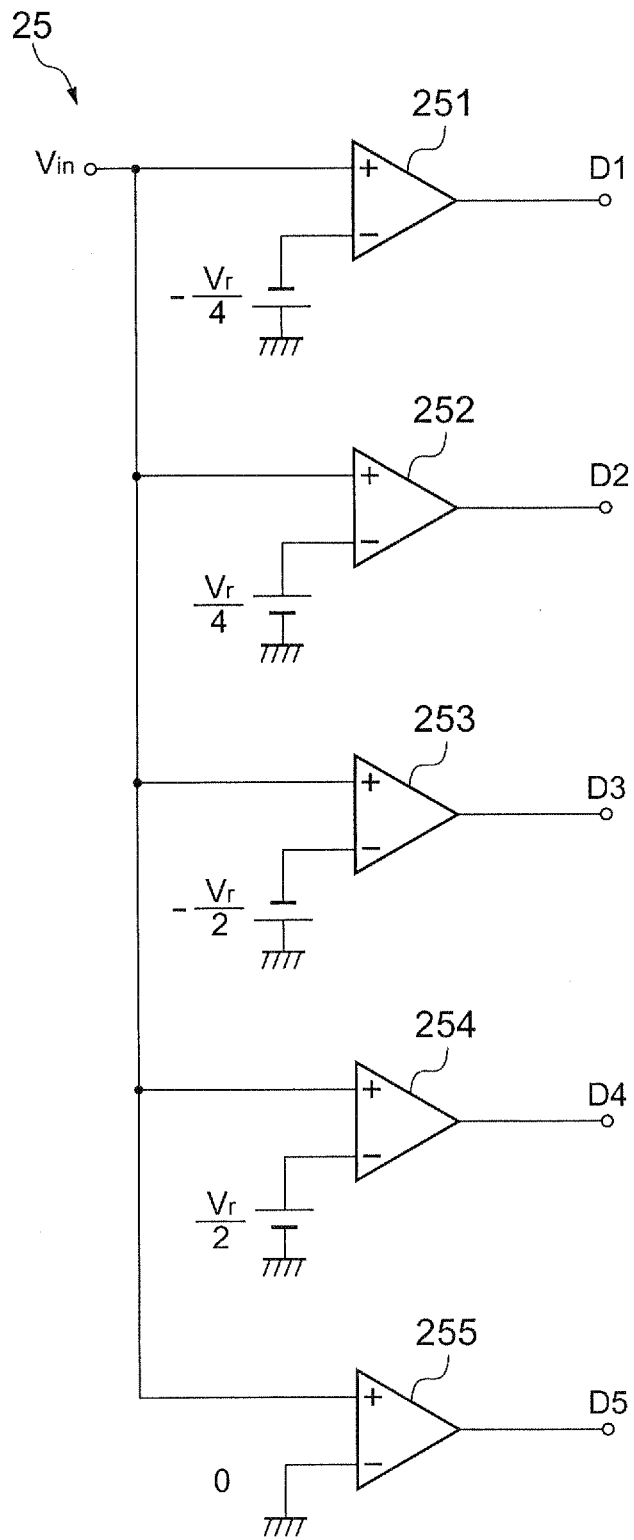
FIG. 3 is a diagram showing a circuit configuration of an FADC.

The FADC 25 is described with reference to FIG. 3. FIG. 3 is a diagram showing a configuration of the FADC 25. The FADC 25 is configured to include five comparators 251 to 255. An input $V_{in}$ is connected to the non-inverted inputs of five comparators 251 to 255. A voltage source of $-V_r/4$ is connected to the inverted input of the comparator 251. It is noted that $V_r$ is a reference voltage used as a reference value of A/D conversion in the ADC 22. The comparator 251 compares $V_{in}$ with $-V_r/4$, and outputs a binary signal corresponding to the comparison result to an output $D_1$. The comparator 251 outputs a high-level signal when $V_{in}$ is greater than $V_r/4$ or outputs a low-level signal when $V_{in}$ is smaller than $-V_r/4$. A voltage source of $V_r/4$ is connected to the inverted input of the comparator 252. The comparator 252 compares $V_{in}$ with $V_r/4$, and outputs a binary signal corresponding to the comparison result to an output $D_2$. The comparator 252 outputs a high-level signal when $V_{in}$ is greater than $V_r/4$ or outputs a low-level signal when $V_{in}$ is smaller than $V_r/4$. The comparator 253 compares $V_{in}$ with $-V_r/2$, and outputs a binary signal corresponding to the comparison result to an output $D_3$. The comparator 253 outputs a high-level signal when $V_{in}$ is greater than $-V_r/2$ or outputs a low-level signal when $V_{in}$ is smaller than $-V_r/2$. A voltage source of $V_r/2$ is connected to the inverted input of the comparator 254. The comparator 254 compares $V_{in}$ with $V_r/2$, and outputs a binary signal corresponding to the comparison result to an output $D_4$. The comparator 254 outputs a high-level signal when $V_{in}$ is greater than $V_r/2$ or outputs a low-level signal when $V_{in}$ is smaller than $V_r/2$. A voltage source of a voltage of zero is connected to the inverted input of the comparator 255. The comparator 255 compares $V_{in}$ with zero, and outputs a binary signal corresponding to the comparison result to an output $D_5$. The comparator 255 outputs a high-level signal when $V_{in}$ is greater than zero or outputs a low-level signal when $V_{in}$ is smaller than zero. It is noted that the output of each stage falls approximately within a range of $-V_r/2$ to $+V_r/2$. Therefore, the input voltage of each stage of the second and rear stages normally falls approximately within the range of $-V_r/2$ to $+V_r/2$ in the second and rear stages. Therefore, it is acceptable to eliminate the comparator 253 and the comparator 254, and omit the comparison of the input voltage with $-V_r/2$ and the comparison of the input voltage with $+V_r/2$ in each stage of the second and rear stages.

Explanation is continued referring back to FIG. 2B. The voltage generator circuit (pcDAC) 26 is provided for outputting an intermediate voltage between a positive reference voltage source and a negative reference voltage source as a precharge voltage according to the output of the FADC 25. The detailed configuration will be described later.

In the precharge phase shown in FIG. 2B, the top plates of the sampling capacitors $C_1'$ and $C_2'$ of the i-th stage are connected to the reference potential GND. At the same time, the bottom plates of $C_1'$ and $C_2'$ are connected to the output of the pcDAC 26. Therefore, in this precharge phase, $C_1'$ and $C_2'$ are charged with the output voltage of the pcDAC 26.

When the precharge phase ends, as shown in FIG. 2C, the (i−1)-th stage shifts to the amplification phase, and the i-th stage shifts to the sample phase at the same time. The operation at this time is similar to that of the conventional type pipelined A/D converter circuit.

Figure 4A:
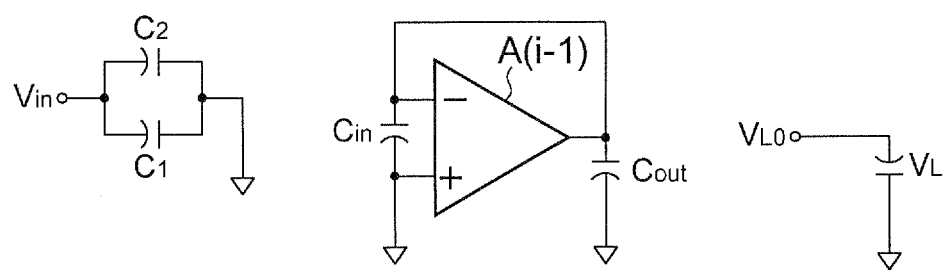
FIGS. 4A and 4B are diagrams showing a charge operation of sampling capacitors by an operational amplifier.
Figure 4B:
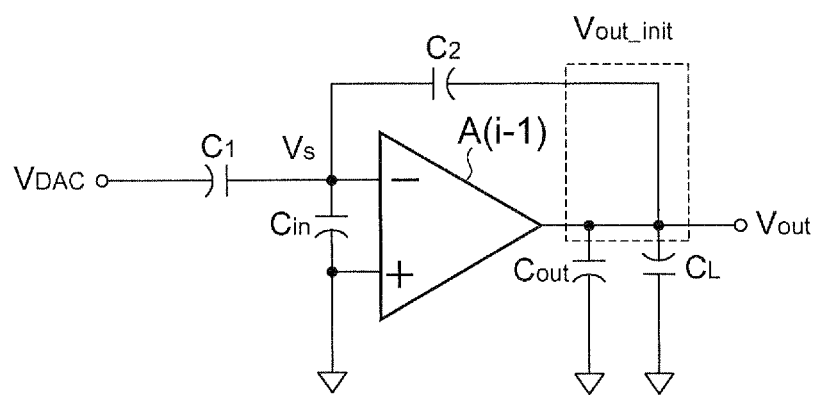

Reference is herein made to what voltage the capacitors $C_1'$ and $C_2'$ should preferably be charged with by the pcDAC 26 in the precharge phase. FIGS. 4A and 4B are diagrams showing connective relations of the sampling capacitors $C_1$ and $C_2$ and the operational amplifier A(i−1) of the (i−1)-th stage with the sampling capacitors $C_1'$ and $C_2'$ of the i-th stage. In FIGS. 4A and 4B, $C_{in}$ represents a parasitic capacitance between the inverted input and the non-inverted input of the operational amplifier A(i−1), and $C_{out}$ represents a parasitic capacitance of the output of the operational amplifier A(i−1). Moreover, $C_L$ collectively represents the sampling capacitors $C_1'$ and $C_2'$ of the i-th stage.

FIG. 4A shows a state in which the (i−1)-th stage is in the sample phase, and the i-th stage is in the amplification phase. At this time, both the sampling capacitors $C_1$ and $C_2$ of the (i−1)-th stage are charged with the voltage $V_{in}$. Moreover, $C_L$ is charged with a voltage $V_{LO}$.

FIG. 4B shows a state in which the (i−1)-th stage has shifted to the amplification phase, and the i-th stage has shifted to the sample phase. At this time, the top plates of $C_1$ and $C_2$ are disconnected from the reference potential GND, and connected to the inverted input of the operational amplifier A(i−1). The bottom plate of $C_1$ is connected to the output of the DAC 23(i−1), and its electrical potential becomes $V_{DAC}$. Moreover, the bottom plate of $C_2$ is connected to the output of the operational amplifier A(i−1). Further, $C_L$ is also connected to the output of the operational amplifier A(i−1). In this case, assuming that the initial voltage of the transient response at the output node of the operational amplifier A(i−1) immediately after the (i−1)-th stage has shifted to the amplification phase and the i-th stage has shifted to the sample phase is $V_{out\_init}$, then $V_{out\_init}$ is expressed by the following Equation (1):

$$V_{out\_init} = \frac{C_2 C_{in} V_{in} + C_1 C_{in} V_{DAC} + (C_1 + C_2 + C_{in}) V_{LO}}{(C_1 + C_2 + C_{in})(C_L + C_{out}) + (C_1 + C_{in}) C_2}. \quad (1)$$

Moreover, in a case where precharge is not performed, the voltage $V_{LO}$ of $C_L$ when the i-th stage is in the amplification phase is expressed by the following Equation (2) by using the output voltage $V_{DAC\_2nd}$ of the DAC 23(i) of the i-th stage when the i-th stage is in the amplification phase, the output voltage $V_{OUT\_2nd}$ of the i-th stage, and the voltage $V_{s\_2nd}$ of the inverted input of the operational amplifier A(i−1) of the (i−1)-th stage:

$$V_{LO} = \frac{C_1}{C_1 + C_2} V_{DAC\_2nd} + \frac{C_2}{C_1 + C_2} V_{OUT\_2nd} - V_{s\_2nd}. \quad (2)$$

When the (i−1)-th stage shifts to the amplification phase, the operational amplifier A(i−1) charges the sampling capacitor $C_L$ with the aforementioned initial voltage $V_{out\_init}$ to a target output voltage value corresponding to the input $V_{in}$. The greater the difference between the initial voltage $V_{out\_init}$ and the target output voltage value, the more time consumed for charging $C_L$. Therefore, when the difference between the initial voltage $V_{out\_init}$ and the target output voltage value is maximized, the time for charging $C_L$ becomes the longest. The minimum time cycle necessary for each stage of the pipelined A/D converter circuit is determined and the operating speed is limited so that $C_L$ can be sufficiently charged even when the time consumed for charging $C_L$ becomes the longest.

Accordingly, if the difference between the initial voltage $V_{out\_init}$ and the target output voltage value can be reduced, the time consumed for charging $C_L$ can be shortened, and the operating speed of the pipelined A/D converter circuit can be improved.

Figure 5:
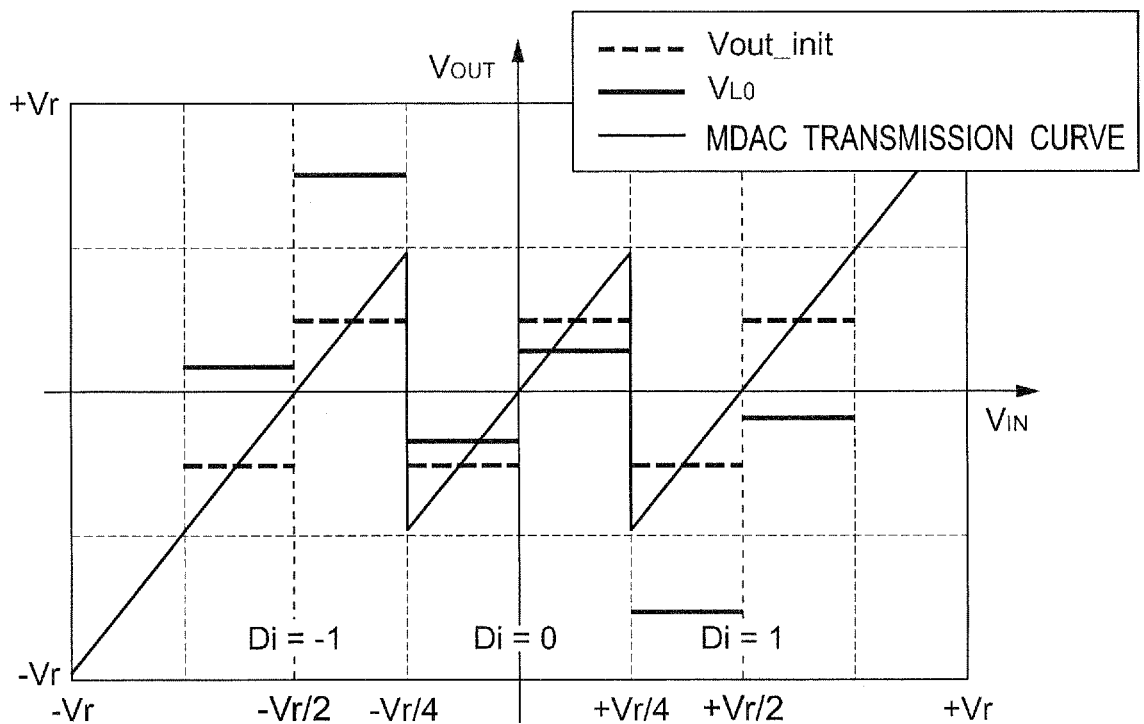
FIG. 5 is a graph showing an input-output characteristic of a multiplier D/A converter circuit and the charging voltages of the sampling capacitors.

FIG. 5 shows a transmission curve of the multiplier D/A converter circuit (MDAC) of each pipeline stage by thin lines. The transmission curve of the MDAC is the value of an output $V_{out}$ that should be outputted in response to the input $V_{in}$ of the MDAC. The transmission curve of the MDAC is expressed by three straight lines corresponding to the digital value $D_i$ outputted from the ADC 22. That is, $D_i=-1$ and $V_{out}=2V_{in}+V_r$ when $-V_r \leq V_{in} < -V_r/4$;

$D_i=0$ and $V_{out}=2V_{in}$ when $-V_r/4 \leq V_{in} \leq V_r/4$; and $D_i=1$ and $V_{out}=2V_{in}-V_r$ when $V_r/4 < V_{in} \leq V_r$.

The transmission curve of the MDAC becomes the target output voltage value as described above. Accordingly, if $V_{out\_init}$ is brought to be close to the transmission curve of the MDAC, the charging time of $C_L$ can be shortened. Accordingly, in the present preferred embodiment, the value of $V_{out\_init}$ is switched over according to the value of $V_{in}$, and $V_{out\_init}$ is brought to be close to the transmission curve of the MDAC according to the value of $V_{in}$. In concrete, for example, when $V_{in}$ is fallen within a range in which $-3V_r/4 < V_{in} \leq -V_{in}/2$, the transmission curve of the MDAC is fallen within a range in which $-V_r/2 < V_{in} \leq 0$ from FIG. 5. Accordingly, if $V_{out\_init}$ is assumed to be $-V_r/4$ that is the intermediate value between $-3V_r/4$ and $-V_{in}/2$ within a range in which $-3V_r/4 < V_{in} \leq -V_r/2$, the maximum value of a difference between the transmission curve of the MDAC and $V_{out\_init}$ when $V_{in}$ is fallen within the range in which $-3V_r/4 < V_{in} \leq -V_r/2$ can be minimized. Therefore, when $V_{in}$ is fallen within the range in which $-3V_r/4<V_{in}\leq -V_r/2$, $V_{out\_init}$ is made to be $-V_r/4$. In a manner similar to the above, $V_{out\_init}$ is made to be $-V_r/4$ within a range in which $-V_r/4<V_{in}<0$ and $V_r/4\leq V_{in}<V_r/2$; and $V_{out\_init}$ is made to be $V_r/4$ within a range in which $-V_r/2\leq -V_r/4$, $0\leq V_{in}<V_r/4$, and $V_r/2\leq V_{in}<3V_r/4$.

The relation between $V_{in}$ and $V_{out\_init}$ is indicated by dashed lines in FIG. 5.

Moreover, $V_{out\_init}$ and $V_{L0}$ have the relation of the Equation (1). Accordingly, the voltage value $V_{L0}$ with which $C_L$ should be precharged in the sample phase of the (i−1)-th stage can be calculated backward from the desired value of $V_{out\_init}$. The relation of $V_{L0}$ to $V_{in}$ thus calculated backward is indicated by thick solid lines in FIG. 5.

Figure 6:
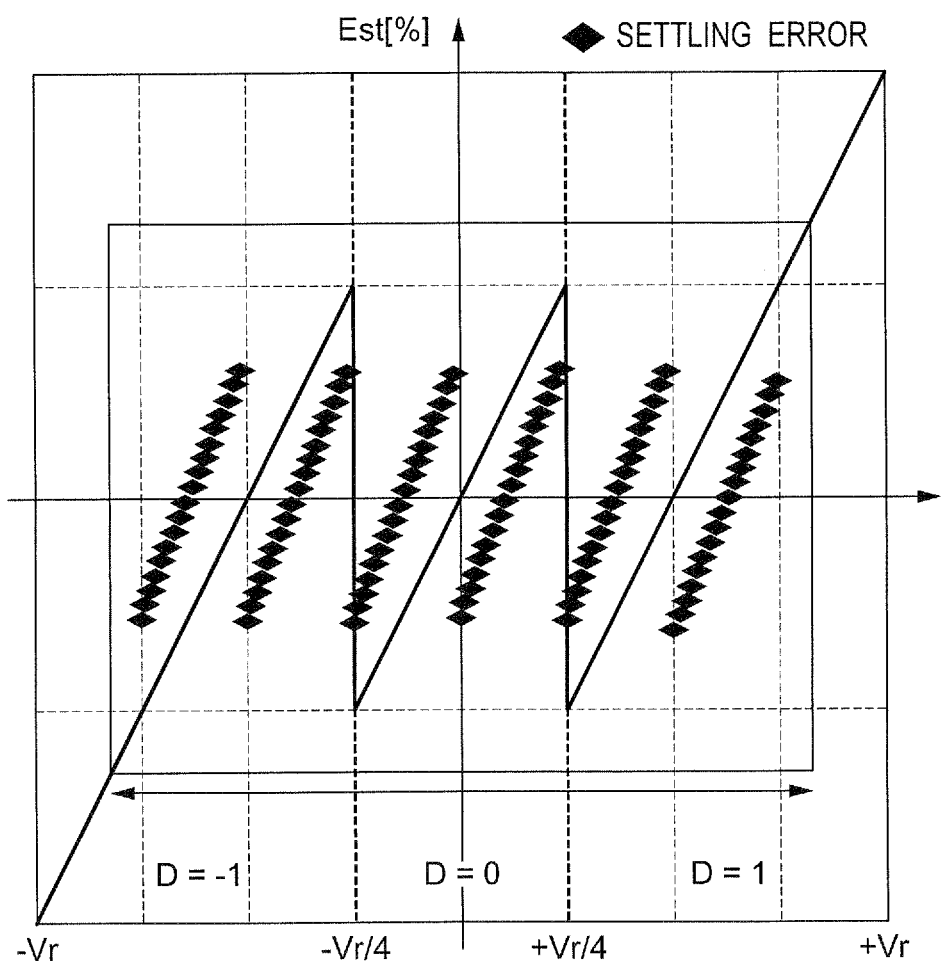
FIG. 6 is a graph showing characteristics of a settling error in the pipelined A/D converter circuit of the present preferred embodiment.
Figure 19:
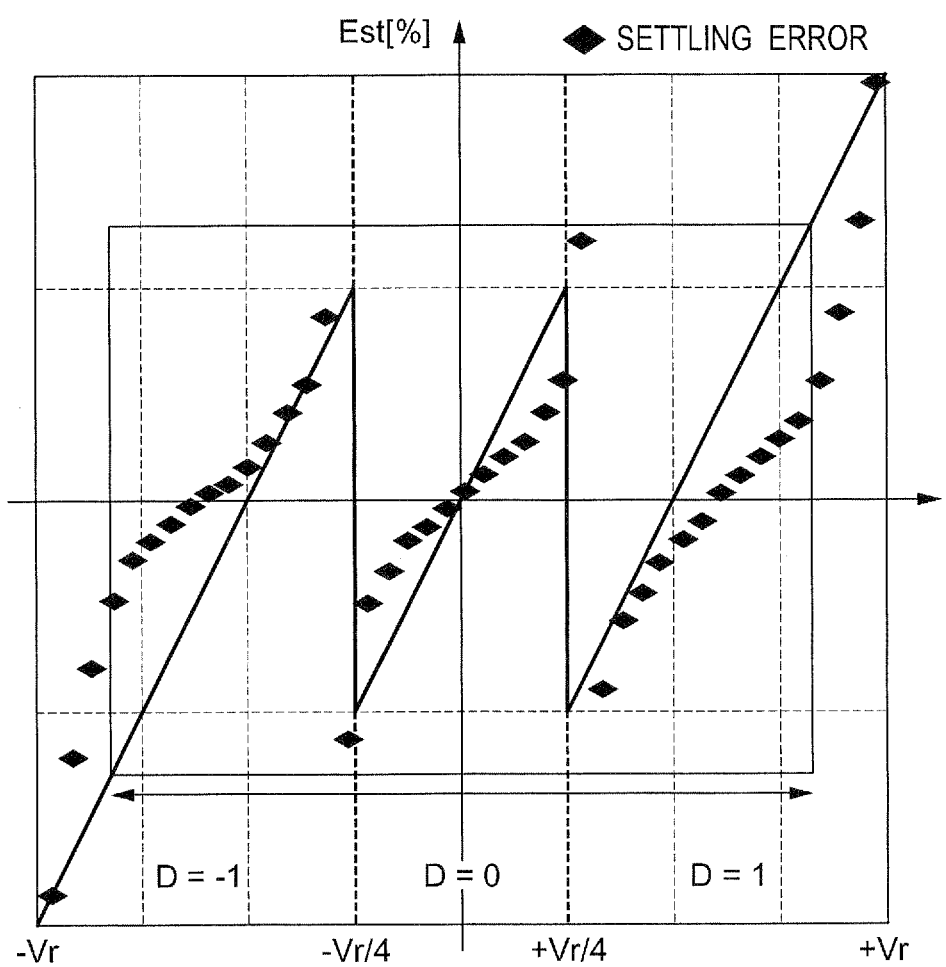
FIG. 19 is a graph showing characteristics of a settling error in the conventional pipelined A/D converter circuit.

FIG. 6 shows simulation results of the settling error characteristic of the MDAC when the precharge of $C_L$ is performed as described above. As shown in FIG. 6, the linearity of the settling error with respect to $V_{in}$ is improved by comparison to the transfer characteristic (See FIG. 19) of the MDAC that performs no precharge.

In this case, as a method of giving a precharge voltage to $C_L$, a method of using a reference voltage source to output the aforementioned optimum voltage can also be considered. However, power consumption increases, and the circuit scale of the analog circuit part that constitutes the reference voltage sources also increases when the reference voltage sources increases in number, and this is disadvantageous in terms of the mounting area. Accordingly, in the present preferred embodiment, the precharge voltage is generated by charge redistribution when the connection of the capacitors is changed.

Figure 7:
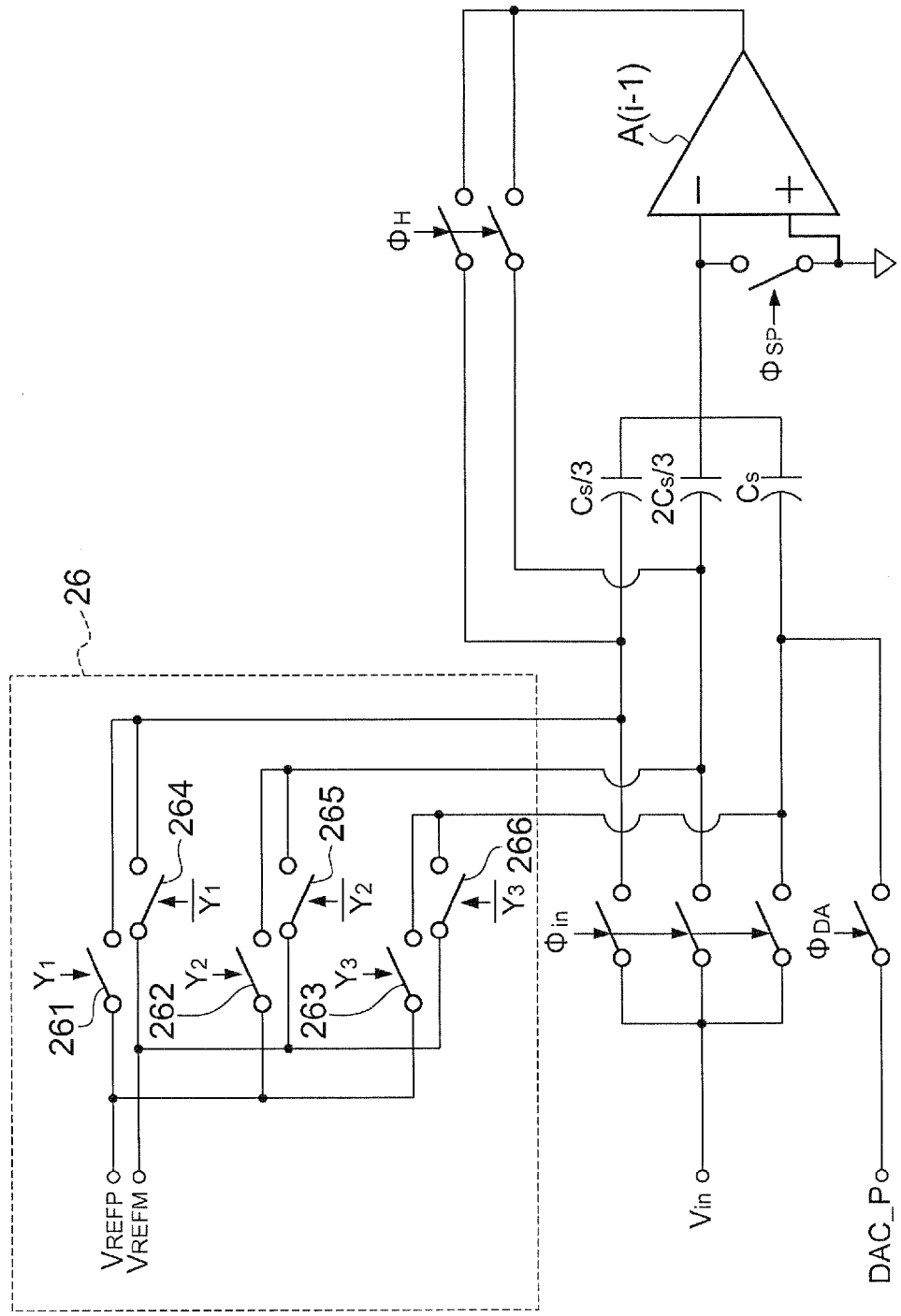
FIG. 7 is a diagram showing a reference voltage generator circuit.

A concrete precharge voltage generating method is described with reference to FIGS. 7 to 10A-10C. FIG. 7 is a diagram showing a circuit to generate a reference voltage by charge redistribution in the present preferred embodiment. It is noted that FIG. 7 is the circuit diagram of a precharge circuit to generate a precharge voltage, and is a single-ended circuit diagram for simplicity of explanation. In the present preferred embodiment, the sampling capacitors $C_1$ and $C_2$, of each stage and a capacitor for generating the precharge voltage are used in common. That is, the capacitor $C_1$ of FIGS. 2A to 2C corresponds to the capacitor $C_s$ of FIG. 7, and the capacitor $C_2$ of FIGS. 2A to 2C corresponds to the parallel connection of the capacitor $C_s/3$ and $2C_s/3$ of FIG. 7. The three capacitors $C_s/3$, $2C_s/3$ and $C_s$ as described above are connected by arbitrary switchover by six internal switches 261 to 266 of the pcDAC 26.

Figure 8:
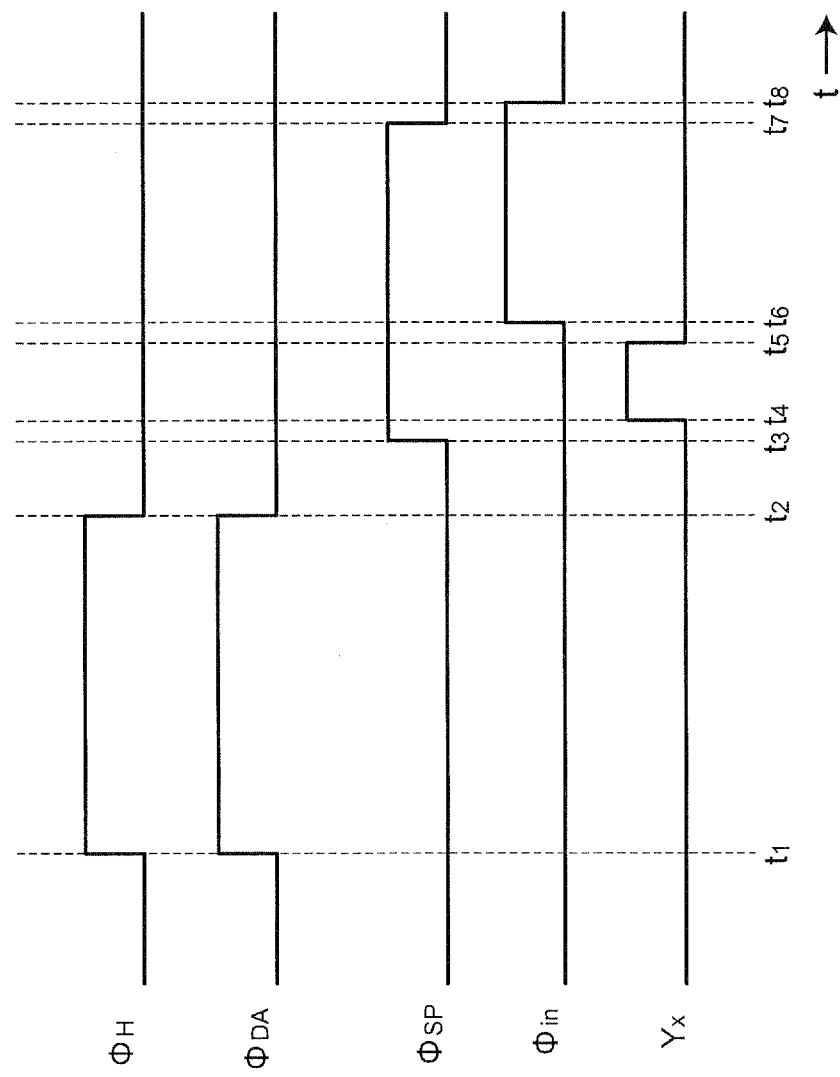
FIG. 8 is a chart showing waveforms of clocks inputted to the reference voltage generator circuit.

FIG. 8 shows a timing chart of clocks supplied to the reference voltage generator circuit of FIG. 7. Clocks $\phi_H$ and $\phi_{DA}$ rise at the time $t_1$, then the bottom plate of the capacitor $C_s$ is connected to the output DAC_P of the DAC 23, and the bottom plates of the capacitor $C_s/3$ and the capacitor $2C_s/3$ are connected to the output of the amplifier A, starting the amplification phase. Next, the clocks $\phi_H$ and $\phi_{DA}$ fall at the time $t_2$, then the bottom plate of the capacitor $C_s$ is disconnected from the output DAC_P of the DAC 23, and the bottom plates of the capacitor $C_s/3$ and the capacitor $2C_s/3$ are disconnected from the output of the amplifier A, ending the amplification phase. Then, $\phi_{SP}$ rises at the time $t_3$, then the top plates of the three capacitors $C_s/3$, $2C_s/3$ and $C_s$ are connected to the reference potential GND.

Next, a control signal Yx (where x is an integer of 1 to 3) varies at the time $t_4$ to properly become a high-level or low-level signal, then the six switches 261 to 266 in the pcDAC 26 are brought into the ON state or the OFF state. As a result, the bottom plates of the three capacitors $C_s/3$, $2C_s/3$ and $C_s$ are properly connected in series or parallel between a positive reference voltage $V_{REFP}$ and a negative reference voltage $V_{REFN}$, starting the precharge phase. The control signal Yx varies based on a comparison result signal that the FADC 25 outputs by comparing the input $V_{in}$ with the reference voltage. The way of varying the control signal Yx is described later. Subsequently, the control signal Yx totally falls at the time $t_5$, then the bottom plates of the three capacitors $C_s/3$, $2C_s/3$ and $C_s$ are disconnected from the positive reference voltage $V_{REFP}$ and the negative reference voltage $V_{REFN}$, ending the precharge phase.

Subsequently, a clock $\phi_{in}$ rises at the time $t_6$, then the bottom plates of the three capacitors $C_s/3$, $2C_s/3$ and $C_s$ are connected to the input $V_{in}$ of the stage, starting the sample phase. Then, a clock $\phi_{SP}$ falls at the time $t_7$, then the top plates of the three capacitors $C_s/3$, $2C_s/3$ and $C_s$ are disconnected from the reference potential GND, ending the sample phase. The clock $\phi_{in}$ falls at the time $t_8$, then the bottom plates of the three capacitors $C_s/3$, $2C_s/3$ and $C_s$ are disconnected from the input $V_{in}$ of the stage, ending one cycle.

Next, reference is made to how the control signal $Y_x$ varies according to $V_{in}$, and how the precharge voltage is generated with reference to FIGS. 9A to 10C. In the following description, the positive reference voltage $V_{REFP}$ is assumed to be $+V_r$, and the negative reference voltage $V_{REFN}$ is assumed to be $-V_r$. Moreover, the top plates of the three capacitors $C_s/3$, $2C_s/3$ and $C_s$ are connected to the reference potential GND in accordance with the rise of the clock $\phi_{SP}$. Then, as described below, by forming a combined capacitance by connecting in parallel two of the three capacitors, connecting in series the combined capacitance with the one remaining capacitor by using a first control switch, and thereafter changing the connection of the three capacitors $C_s/3$, $2C_s/3$ and $C_s$ to the parallel connection by using a second control switch, then $C_s/3$, $2C_s/3$ and $C_s$ are charged with the intermediate voltage value between the upper limit $+V_r$ of the reference voltage and $-V_r$.

Figure 9A:
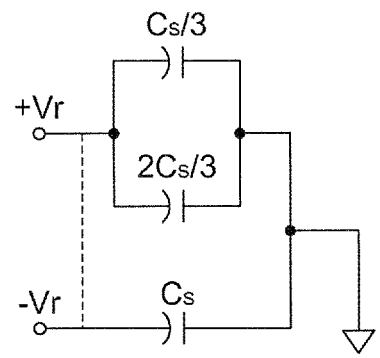
FIGS. 9A, 9B and 9C are diagrams showing an operation of the reference voltage generator circuit.

FIG. 9A is a diagram showing a connection of the three capacitors $C_s/3$, $2C_s/3$ and $C_s$ when $-3V_r/4<V_{in}\leq -V_r/2$. First of all, as indicated by the solid line in FIG. 9A, $Y_1$ and $Y_2$ are made to be a high level, and $Y_3$ is made to be a low level. The bottom plates of the capacitors $C_s/3$ and $2C_s/3$ are connected to $+V_r$, and the bottom plate of the capacitor $C_s$ is connected to $-V_r$. With this arrangement, the capacitors $C_s/3$, $2C_s/3$ and $C_s$ are charged with the electric charges of $+C_sV_r/3$, $+2C_sV_r/3$ and $-C_sV_r$, respectively. Next, as indicated by the dashed line in FIG. 9A, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$, and $C_s$ becomes expressed as $(+C_sV_r/3)+(+2C_sV_r/3)+(-C_sV_r)=0$. Therefore, the voltage $V_{L0}$ outputted to the bottom plates of the three capacitors $C_s/3$, $2C_s/3$ and $C_s$ becomes zero obtained by dividing the electric charge of zero by the combined capacitance expressed as $C_s/3+2C_s/3+C_s=2C_s$ at the time of the parallel connection of the three capacitors $C_s/3$, $2C_s/3$ and $C_s$.

Figure 9B:
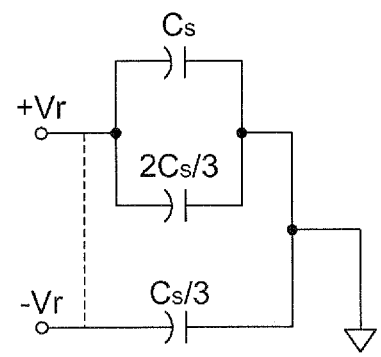

FIG. 9B is a diagram showing a connection of the three capacitors $C_s/3$, $2C_s/3$ and $C_s$ when $-V_r/2<V_{in}\leq -V_r/4$. First of all, as indicated by the solid line in FIG. 9B, $Y_2$ and $Y_3$ are made to be the high level, and $Y_1$ is made to be the low level. The bottom plates of the capacitors $2C_s/3$ and $C_s$ are connected to $+V_r$, and the bottom plate of the capacitor $C_s/3$ is connected to $-V_r$. With this arrangement, the capacitors $C_s$, $2C_s/3$ and $C_s/3$ are charged with electric charges of $+C_sV_r$, $+2C_sV_r/3$ and $-C_sV_r/3$, respectively. Next, as indicated by the dashed line in FIG. 9B, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$ and $C_s$ becomes expressed as $(+C_sV_r)+(+2C_sV_r/3)+(-C_sV_r/3)=+4C_sV_r/3$. Therefore, the voltage $V_{LO}$ outputted to the bottom plates of the three capacitors $C_s/3$, $2C_3/3$ and $C_s$ becomes $+2V_r/3$ obtained by dividing the electric charge of $+4C_sV_r/3$ by the combined capacitance expressed as $C_s/3+2C_s/3+C_s=2C_s$ at the time of the parallel connection of the three capacitors $C_s/3$, $2C_s/3$ and $C_s$.

Figure 9C:
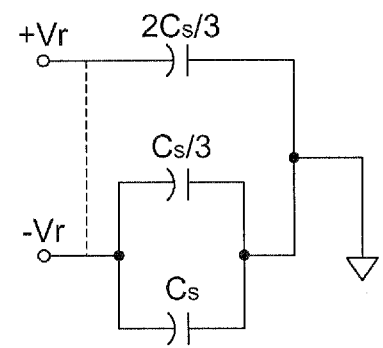

FIG. 9C is a diagram showing a connection of the three capacitors $C_s/3$, $2C_s/3$ and $C_s$ when $-V_r/4<V_{in}<0$. First of all, as indicated by the solid line in FIG. 9C, $Y_2$ is made to be the high level, and $Y_1$ and $Y_3$ are made to be the low level. The bottom plate of the capacitor $2C_s/3$ is connected to $+V_r$, and the bottom plates of the capacitors $C_s/3$ and $C_s$ are connected to $-V_r$. With this arrangement, the capacitors $2C_s/3$, $C_s/3$ and $C_s$ are charged with electric charges of $+2C_sV_r/3$, $-C_sV_r/3$ and $-C_sV_r$, respectively. Next, as indicated by the dashed line in FIG. 9C, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$ and $C_s$ becomes expressed as $(+2C_sV_r/3)+(-C_sV_r/3)+(-C_sV_r)=-2C_sV_r/3$. Therefore, the voltage $V_{LO}$ outputted to the bottom plates of the three capacitors $C_s/3$, $2C_s/3$ and $C_s$ becomes $-V_r/3$ obtained by dividing the electric charge of $-2C_sV_r/3$ by the combined capacitance expressed as $C_s/3+2C_s/3+C_s=2C_s$ at the time of the parallel connection of the three capacitors $C_s/3$, $2C_s/3$ and $C_s$.

Figure 10A:
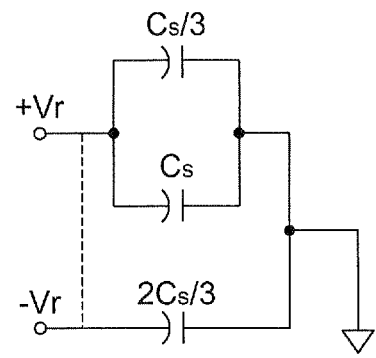
FIGS. 10A, 10B and 10C are diagrams showing an operation of the reference voltage generator circuit.

FIG. 10A is a diagram showing a connection of the three capacitors $C_s/3$, $2C_s/3$, and $C_s$ when $0 \le V_{in}<V_r/4$. First of all, as indicated by the solid line in FIG. 10A, $Y_1$ and $Y_3$ are made to be the high level, and $Y_2$ is made to be the low level. The bottom plates of the capacitors $C_s/3$ and $C_s$ are connected to $+V_r$, and the bottom plate of the capacitor $2C_s/3$ is connected to $-V_r$. With this arrangement, the capacitors $C_s/3$, $C_s$ and $2C_s/3$ are charged with electric charges of $+C_sV_r/3$, $+C_sV_r$ and $-2C_sV_r/3$, respectively. Next, as indicated by the dashed line in FIG. 10A, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$ and $C_s$ becomes expressed as $(+C_sV_r/3)+(+C_sV_r)+(-2C_sV_r/3)=+2C_sV_r/3$. Therefore, the voltage $V_{LO}$ outputted to the bottom plates of the three capacitors $C_s/3$, $2C_s/3$ and $C_s$ becomes $+V_r/3$ obtained by dividing the electric charge of $+2C_sV_r/3$ by the combined capacitance expressed as $C_s/3+2C_s/3+C_s=2C_s$ at the time of the parallel connection of the three capacitors $C_s/3$, $2C_s/3$ and $C_s$.

Figure 10B:
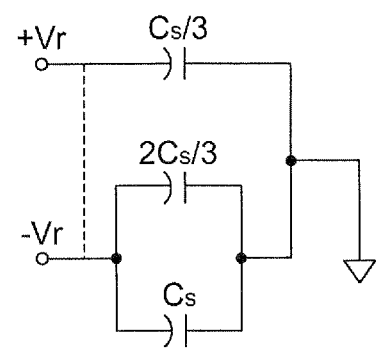

FIG. 10B is a diagram showing a connection of the three capacitors $C_s/3$, $2C_s/3$ and $C_s$ when $V_r/4 \le V_{in}<V_r/2$. First of all, as indicated by the solid line in FIG. 10B, $Y_1$ is made to be the high level, and $Y_2$ and $Y_3$ are made to be the low level. The bottom plate of the capacitor $C_s/3$ is connected to $+V_r$, and the bottom plates of the capacitors $2C_s/3$ and $C_s$ are connected to $-V_r$. With this arrangement, the capacitors $C_s/3$, $2C_s/3$ and $C_s$ are charged with electric charges of $+C_sV_r/3$, $-2C_sV_r/3$ and $-C_sV_r$, respectively. Next, as indicated by the dashed line in FIG. 10B, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$ and $C_s$ becomes expressed as $(+C_sV_r/3)+(-2C_sV_r/3)+(-C_sV_r)=-4C_sV_r/3$. Therefore, the voltage $V_{LO}$ outputted to the bottom plates of the three capacitors $C_s/3$, $2C_s/3$ and $C_s$ becomes $-2V_r/3$ obtained by dividing the electric charge of $-4C_sV_r/3$ by the combined capacitance expressed as $C_s/3+2C_s/3+C_s=2C_s$ at the time of the parallel connection of the three capacitors $C_s/3$, $2C_s/3$ and $C_s$.

Figure 10C:
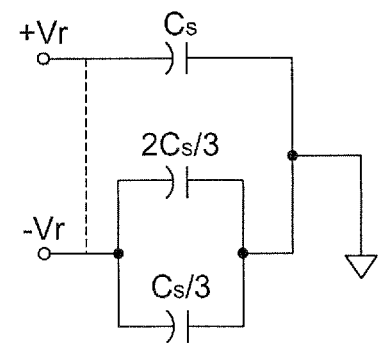

FIG. 10C is a diagram showing a connection of the three capacitors $C_s/3$, $2C_s/3$ and $C_s$ when $V_r/2 \le V_{in}<3V_r/2$. First of all, as indicated by the solid line in FIG. 10C, $Y_3$ is made to be the high level, and $Y_1$ and $Y_2$ are made to be the low level. The bottom plate of the capacitor $C_s$ is connected to $+V_r$, and the bottom plates of the capacitors $2C_s/3$ and $C_s$ are connected to $-V_r$. With this arrangement, the capacitors $C_s$, $2C_s/3$ and $C_s/3$ are charged with electric charges of $+C_sV_r$, $-2C_sV_r/3$ and $-C_sV_r/3$, respectively. Next, as indicated by the dashed line in FIG. 10C, the bottom plates of the three capacitors $C_s/3$, $2C_s/3$ and $C_s$ are disconnected from $+V_r$ and $-V_r$ to connect all of these bottom plates, then the connection of the three capacitors $C_s/3$, $2C_s/3$ and $C_s$ is changed to the parallel connection. As a result, the electric charge charged in the three capacitors $C_s/3$, $2C_s/3$ and $C_s$ becomes expressed as $(+C_sV_r)+(-2C_sV_r/3)+(-C_sV_r/3)=0$. Therefore, the voltage $V_{LO}$ outputted to the bottom plates of the three capacitors $C_s/3$, $2C_s/3$ and $C_s$ becomes zero obtained by dividing the electric charge of zero by the combined capacitance expressed as $C_s/3+2C_s/3+C_s=2C_s$ at the time of the parallel connection of the three capacitors $C_s/3$, $2C_s/3$ and $C_s$.

For the pipelined A/D converter circuit in which the settling error is linearized by precharge described above, a digital error correction circuit for correcting an error included in a digital signal outputted from the circuit is described next. The errors generated in the pipelined A/D converter circuit mainly include a settling error and a finite gain error. The settling error is the error generated as a consequence of insufficient charging of the sampling capacitance from the operational amplifier due to response time shortage in the MDAC. Moreover, the finite gain error is the error generated because the gain of the operational amplifier is finite in the MDAC. Assuming that the gain of the operational amplifier is infinite, the finite gain error is not generated. The digital error correction circuit described below is a circuit for correcting both the settling error and the finite gain error.

The algorithm of correction processing in the digital error correction circuit is described below. First of all, it is assumed that the input signal of the i-th stage is $X_i$, and a value obtained by A/D converting the input signal $X_i$ is $D_{CODE}$. At this time, assuming that the reference voltage is $V_r$, then the range of the input signal $X_i$ is expressed by the following Equation (3):

$$-1 \le X_i \left( = \frac{D_{CODE}}{V_r} \right) \le 1. \tag{3}$$

Moreover, the ideal value $X_{i+1}$ of the output of the i-th stage is expressed by the following Equation (4):

$$X_{i+1} = 2X_i - D_i \tag{4}.$$

In this case, $D_i$ denotes a digital signal after the ADC 22 performs A/D conversion of $X_i$. In this case, the ADC 22 is described as a 1.5-bit ADC. In this case, $D_i=-1$ when $-V_r \le V_{in} < -V_r/4$, $D_i=0$ when $-V_r/4 \le V_{in} \le V_r/4$, and $D_i=1$ when $V_r/4 < V_{in} \le V_r$.

If the Equation (4) is solved for $X_i$, the following Equation (5) holds:

$$X_i = \frac{1}{2}X_{i+1} + \frac{1}{2}D_i. \qquad (5)$$

On the other hand, taking the settling error and the finite gain error included by the MDAC into consideration, $X_{i+1}$ of the Equation (4) becomes expressed by the following Equation (6):

$$X_{i+1} = 2(1+a_i'+b_i')X_i - (1+a_i'+b_i')D_i \qquad (6).$$

In the Equation (6), $a_i'$ denotes a coefficient that represents the finite gain error of the MDAC of the i-th stage. Moreover, $b_i'$ denotes a coefficient that represents the settling error of the MDAC of the i-th stage. In the conventional pipelined A/D converter circuit that does not perform precharge, the operational amplifier included by the MDAC operates not only in the transconductance region but also in the slewing region, and therefore, $a_i'$ and $b_i'$ are functions of $X_i$ fluctuating in accordance with the fluctuation of $X_i$. That is, $a_i'$ and $b_i'$ have input signal dependence. Therefore, a non-linear correction is necessary for $X_i$ in order to correct the finite gain error and the settling error. Therefore, the correction circuit for performing the correction becomes complicated.

On the other hand, in the pipelined A/D converter circuit that performs precharge described hereinabove, the operational amplifier included by the MDAC operates only in the transconductance region, and therefore, the finite gain error and the settling error become linear to $X_i$.

Figure 11A:
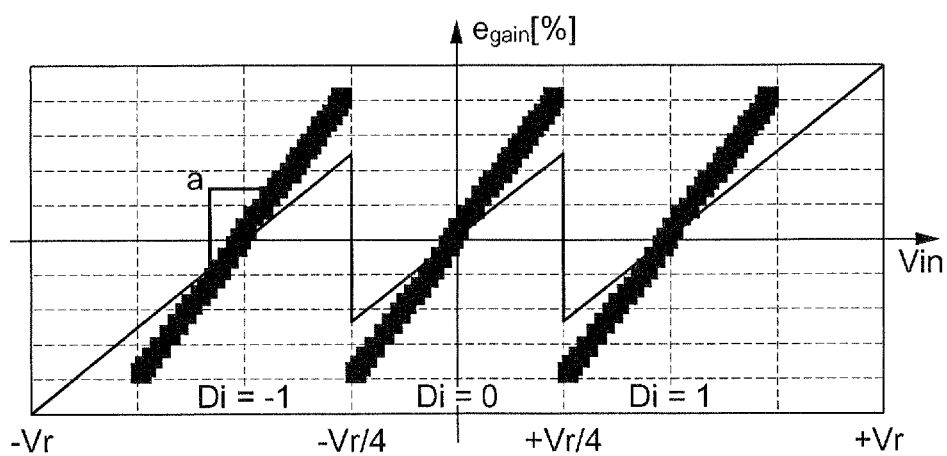
FIGS. 11A and 11B are graphs showing a finite gain error and a settling error of the multiplier D/A converter circuit.
Figure 11B:
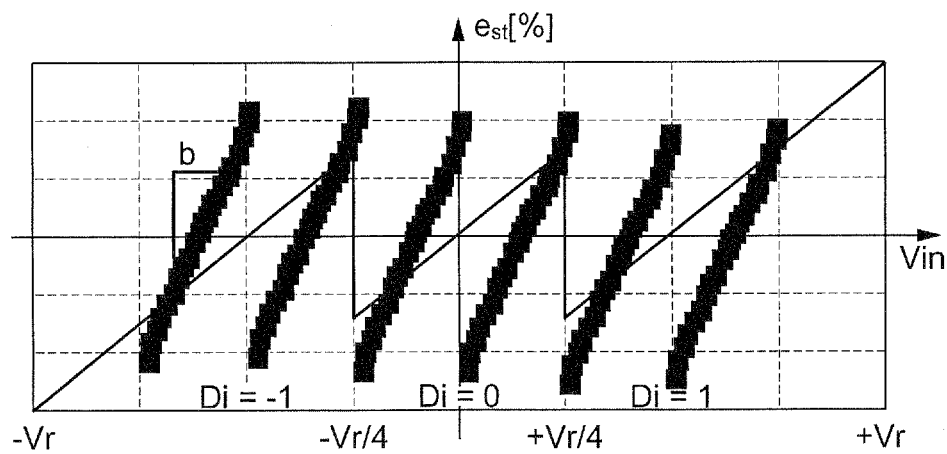

The dependence of the finite gain error and the settling error on the input voltage is shown in FIGS. 11A and 11B. FIG. 11A is a graph showing simulation results of the change of the finite gain error $e_{gain}$ when the MDAC is operated at 100 MHz, and the precharge is performed with respect to the input voltage $V_{in}$ to the MDAC. FIG. 11B is a graph showing simulation results of the change of the settling error $e_{st}$ when the MDAC is operated at 100 MHz, and the precharge is performed with respect to the input voltage $V_{in}$ to the MDAC. The finite gain error $e_{gain}$ has almost identical slope and offset in each of the three regions of $-3V_r/4 \leq V_{in} < -V_r/4$, $-V_r/4 \leq V_{in} \leq V_r/4$, and $V_r/4 < V_{in} \leq 3V_r/4$, and changes almost linear to $V_{in}$ in each of the regions. The settling error $e_{st}$ has almost identical slope and offset in each of the six regions of $-3V_r/4 \leq V_{in} < -V_r/2$, $-V_r/2 \leq V_{in} < -V_r/4$, $-V_r/4 \leq V_{in} < 0$, $0 < V_{in} \leq V_r/4$, $V_r/4 < V_{in} \leq V_r/2$, and $V_r/2 < V_{in} \leq 3V_r/4$, and changes almost linear to $V_{in}$ in each of the regions.

As described above, in the pipelined A/D converter circuit that performs precharge, $a_i'$ and $b_i'$ can each be regarded as a constant that does not depend on the value of $X_i$. Therefore, in order to correct the finite gain error and the settling error, it is proper to perform linear correction for $X_i$. Therefore, the correction circuit for performing the correction can be a simple one described below. Hereinafter, reference is made on the assumption that $a_i'$ and $b_i'$ are referred to as a constant $a_i$ and a constant $b_i$, respectively.

Figures 12A, 12B:
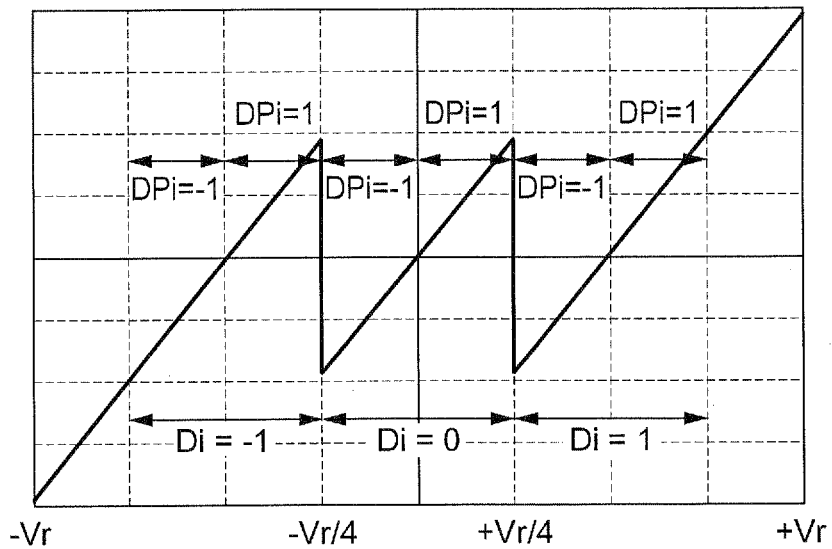
FIGS. 12A and 12B are a graph and a table showing an input and output characteristic of a sub-A/D converter circuit.

Digital codes $D_i$ and $DP_i$ used for the following corrections are described with reference to FIGS. 12A and 12B. As shown in the graph of FIG. 12A and the table of FIG. 12B, $D_i = -1$ and $DP_i = -1$ when $-3V_r/4 \leq V_{in} < -V_r/2$, $D_i = -1$ and $DP_i = 1$ when $-V_r/2 \leq V_{in} < -V_r/4$, $D_i = 0$ and $DP_i = -1$ when $-V_r/4 \leq V_{in} < 0$, $D_i = 0$ and $DP_i = 1$ when $0 \leq V_{in} < V_r/4$, $D_i = 1$ and $DP_i = -1$ when $V_r/4 \leq V_{in} < V_r/2$, and $D_i = 1$ and $DP_i = 1$ when $V_r/2 \leq V_{in} < 3V_r/4$.

If the digital codes $D_i$ and $DP_i$ as described above are used, then $X_{i+1}$ of the Equation (6) can be expressed by the following Equation (7):

$$X_{i+1} = 2(1+a_i+b_i)X_i - (1+a_i+b_i)D_i - \frac{1}{4}b_iDP_i. \qquad (7)$$

This is transformed into the following Equation (8):

$$X_i = \frac{1}{2}(X_{i+1} + D_i) + a_i\left(X_i - \frac{1}{2}D_i\right) + b_i\left(X_i - \frac{1}{2}D_i - \frac{1}{8}DP_i\right). \qquad (8)$$

By comparing the Equation (5) with the Equation (8), it can be understood that the finite gain error $e_{gain}[i]$ and the settling error $e_{st}[i]$ of the i-th stage are expressed by the following Equation (9) and Equation (10), respectively:

$$e_{gain}[i] = a_i\left(X_i - \frac{1}{2}D_i\right), \text{ and} \qquad (9)$$

$$e_{st}[i] = b_i\left(X_i - \frac{1}{2}D_i - \frac{1}{8}DP_i\right). \qquad (10)$$

Therefore, by obtaining the errors from the Equation (9) and the Equation (10) and subtracting $e_{gain}[i]$ and $e_{st}[i]$ from $X_i$, correction of $X_i$ can be performed.

Moreover, by obtaining $X_i$ using $X_{i+1}$, $D_i$ and $DP_i$ according to the following Equation (11), the errors can also be corrected:

$$X_i = \frac{X_{i+1}}{2(1+a_i+b_i)} + \frac{1}{2}D_i + \frac{b_i}{8(1+a_i+b_i)}DP_i. \qquad (11)$$

The Equation (11) is provided for obtaining $X_i$ from $X_{i+1}$, $a_i$ and $b_i$. That is, according to the Equation (11), by using the value of $X_{i+1}$ that is the input value of the (i+1)-th stage, the value of $X_i$ that is the input value of the i-th stage, or the front stage, can be obtained. From the thus-obtained value of $X_i$, it is also possible to obtain $X_{i-1}$ that is the input value of the (i-1)-th stage in a manner similar to that of the Equation (11). By repeating the above calculations, corrections can be performed backward from the rear stages to the first stage.

Figure 13:
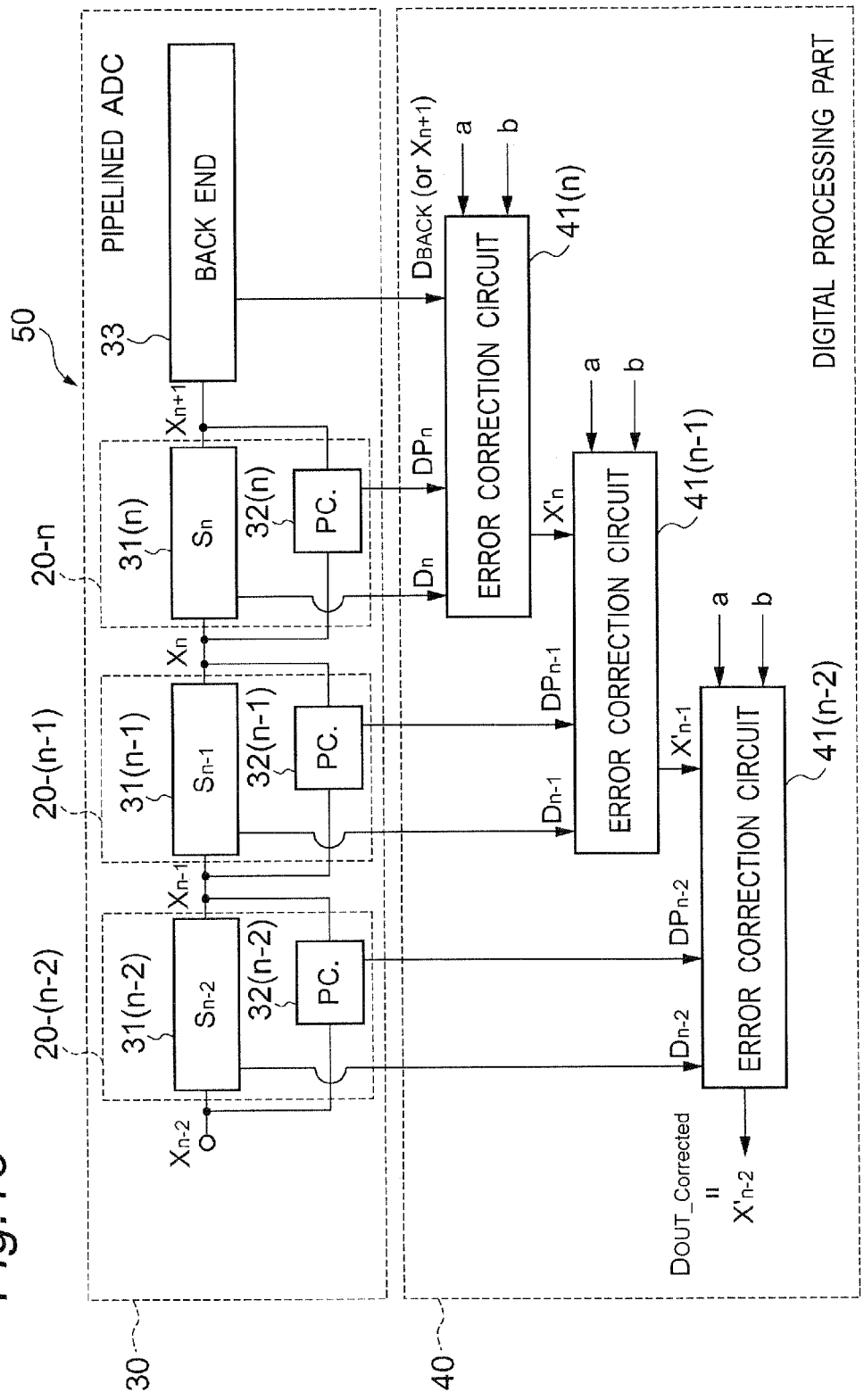
FIG. 13 is a diagram showing a configuration of a digital error correction circuit.

FIG. 13 shows a pipelined A/D converter circuit having a digital error correction circuit to execute the algorithm described above. In this example, a case where $X_n$ of the superordinate three stages is corrected is shown.

A pipelined A/D converter circuit 50 according to the present preferred embodiment is configured to include a pipelined A/D converter circuit main part 30, and a digital error correction circuit 40. The pipelined A/D converter circuit main part 30 A/D converts an input $X_{n-2}$, and outputs the digital signal of the result of conversion to the digital error correction circuit 40. The digital error correction circuit 40 corrects the error of the digital signal inputted from the pipelined A/D converter circuit main part 30, and outputs $X'_{n-2}$ of the result of conversion.

The pipelined A/D converter circuit main part 30 is constituted by connecting A/D converter circuit parts 20 of a plurality of stages in cascade, and further connecting a back end part 33 to the rear stage. In this case, the A/D converter circuit part 20-$n$ of the n-th stage is configured to include a MDAC 31($n$) and a pcDAC 32($n$).

The MDAC 31($n$) is a functional block that A/D converts the analog input $X_n$ to output $D_n$ shown in FIGS. 12A and 12B, converts $D_n$ into an analog form, subtracts the analogue conversion result of $D_n$ from $X_n$, amplifies the subtraction result, and outputs the resulting signal to the analog output $X_{n+1}$. The MDAC 31($n$) is configured to include the sample hold part 21, the ADC 22, the DAC 23 and the residue gain amplifier 24 shown in FIG. 17 in terms of the concrete circuit configuration.

The PcDAC 32 is a functional block that outputs the digital output $DP_n$ shown in FIGS. 12A and 12B according to the value of the analog input $X_n$. The PcDAC 32 is configured to include the FADC 25 shown in FIG. 3, and a logic circuit to generate the comparison result signal $DP_i$ shown in FIGS. 12A and 12B by combining the output signals of the comparators 251 to 255 included in the FADC 25 in terms of the concrete circuit configuration.

The back end part 33 is a circuit that includes all of the A/D converter circuit parts 20 connected subsequent to the A/D converter circuit part 20-$n$ of the n-th stage in the pipelined A/D converter circuit main part 30. That is, the back end part 33 itself serves as a pipelined A/D converter circuit that has stages less in number by three than those of the pipelined A/D converter circuit main part 30. The back end part 33 makes $D_{BACK}$ by A/D converting the analog input $X_{n+1}$, and outputs this $D_{BACK}$ to the digital error correction circuit 40.

The digital error correction circuit 40 is constituted by connecting error correction circuits 41 in cascade. Among the error correction circuits 41 connected in cascade, the error correction circuit 41($n$) corresponding to the first stage is a circuit that calculates and outputs $X'_n$ corresponding to the corrected value of $X_n$ by using $D_n$, $DP_n$ and $D_{BACK}$. In concrete, the digital error correction circuit 40 calculates the corrected value $X'_n$ of $X_n$ by using the Equation (11). In this case, $D_{BACK}$ outputted from the back end part 33 is used as $X_{i+1}$ of the Equation (11).

Among the error correction circuits 41, the error correction circuit 41($n$-1) corresponding to the other than the first stage is a circuit that calculates and outputs $X'_{n-1}$ corresponding to the corrected value of $X_{n-1}$ by using $D_{n-1}$ $DP_{n-1}$, and $X'_n$. In concrete, the digital error correction circuit 40 calculates the value $X'_{n-1}$ of $X_n$ by using the Equation (11). In this case, $X'_n$ outputted from the error correction circuit 41($n$) is used as $X_{i+1}$ of the Equation (11). That is, the error correction circuit 41($n$-1) corrects the input signal $X_{n-1}$ outputted from the MDAC 31($n$-1) by using the digital signal $D_{n-1}$ outputted from the MDAC 31($n$-1), the comparison result signal $DP_{n-1}$ outputted from the pcDAC 32($n$-1), and the input signal $X'_n$ corrected by the error correction circuit 41($n$) of another stage. Moreover, the error correction circuit 41($n$-2) similarly corrects the input signal $X_{n-2}$ outputted from the MDAC 31($n$-1) by using the digital signal $D_{n-2}$ outputted from the MDAC 31($n$-1), the comparison result signal $DP_{n-2}$ outputted from the pcDAC 32($n$-1), and the input signal $X'_{n-1}$ corrected by the error correction circuit 41($n$-1) of another stage. In this example, the MDAC 31($n$-2) is the MDAC of the first stage in the pipelined A/D converter circuit main part 30, where $X_{n-2}$ inputted to the MDAC 31($n$-2) is corrected, and the final corrected result is outputted as $X'_{n-2}$= $D_{OUT\_Corrected}$.

As described above, in the digital error correction circuit 40, $X_n$ of the input of the MDAC 31 on the front stage side is obtained based on the digital signal $D_n$ outputted from the MDAC 31 of the pipelined A/D converter circuit main part 30, the comparison result signal $DP_n$ outputted from the pcDAC 32, and $X_{n+1}$ of the input of the MDAC 31 on the rear stage side of the pipelined A/D converter circuit main part 30. By sequentially retracing $X_{n-1}$, $X_{n-2}$, . . . on the front stage side in a similar manner, corrections to the first stage are performed.

Figure 14A:
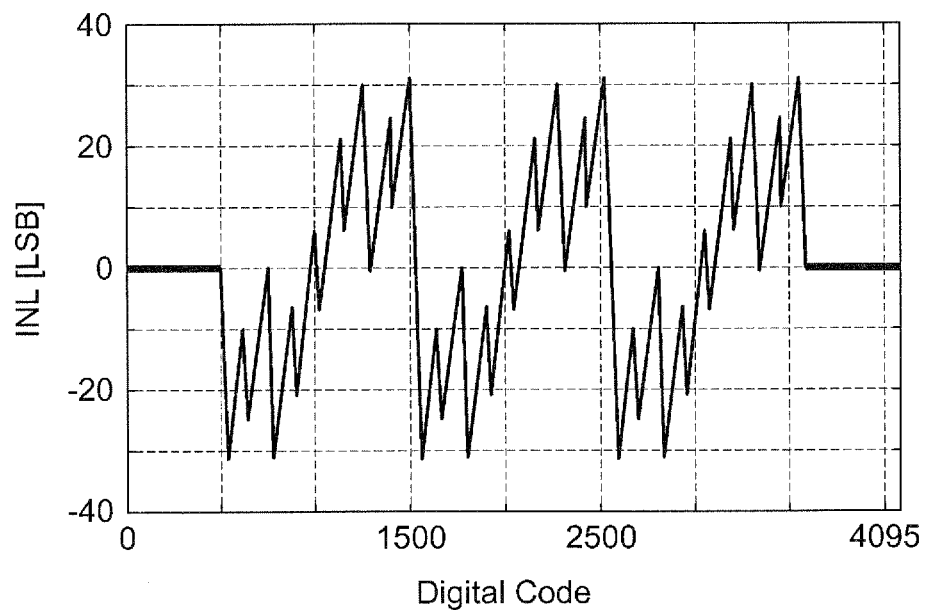
FIGS. 14A and 14B are graphs showing a difference of integral non-linearity depending on the presence or absence of correction using the digital error correction circuit.
Figure 14B:
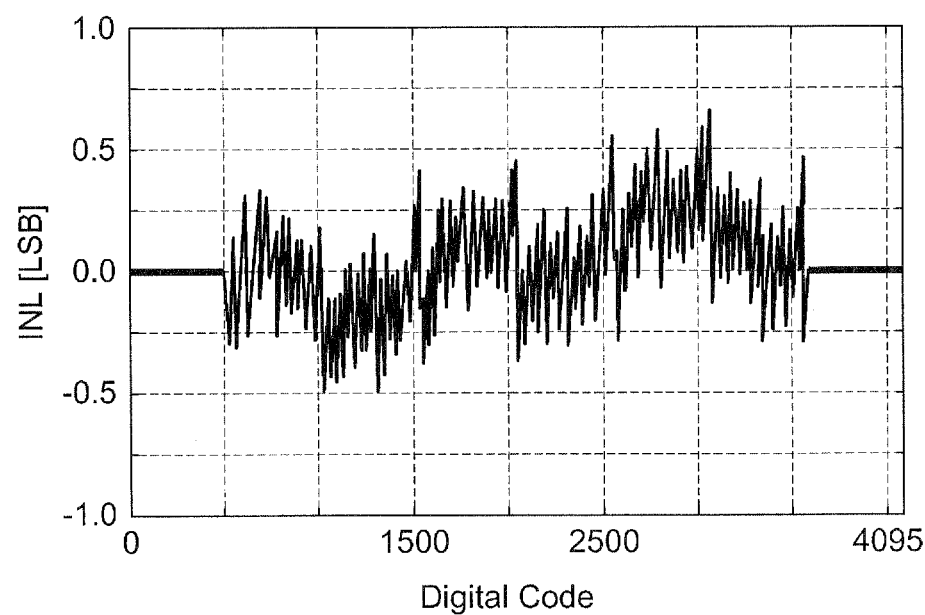

FIGS. 14A and 14B show a difference depending on the presence or absence of the digital correction of errors in the pipelined A/D converter circuit described above. FIG. 14A is a diagram showing an integral non-linearity (INL) before the finite gain error and the settling error are digitally corrected in a 12-bit pipelined A/D converter circuit. FIG. 14B is a diagram showing an integral non-linearity after the finite gain error and the settling error are digitally corrected in the identical 12-bit pipelined A/D converter circuit. FIG. 14B shows results in a case where all the stages are subjected to correction. In contrast to the fact that the integral non-linearity before correction in FIG. 14A is about 30 LSB (Least Significant Bit), the integral non-linearity after correction in FIG. 14B is about 0.6 LSB, exhibiting a remarkable improvement of the integral non-linearity.

Figure 15:
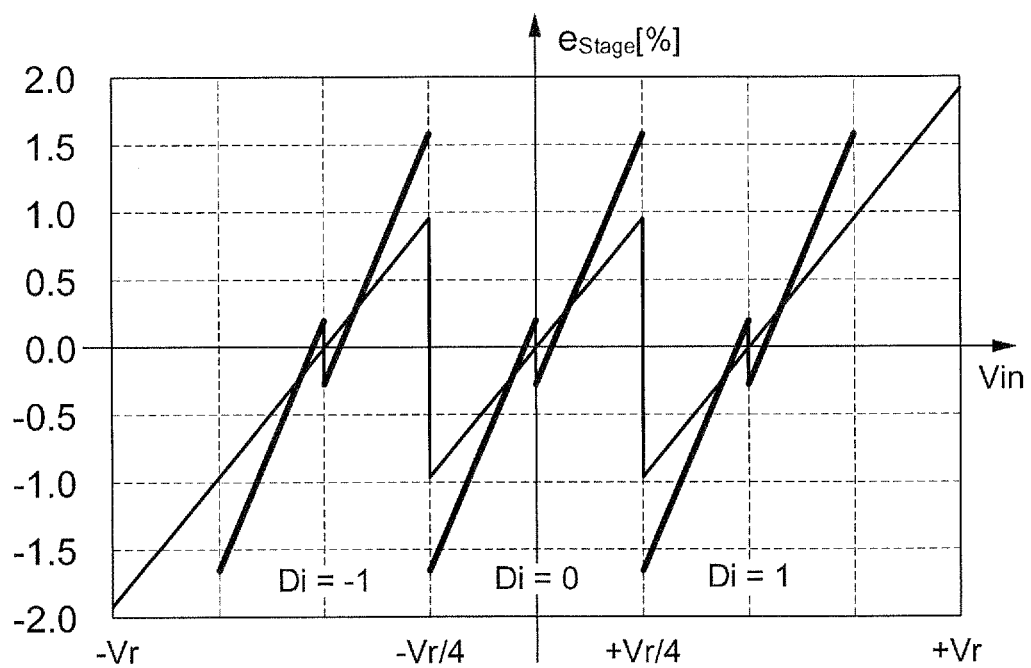
FIG. 15 is a graph showing an error of the multiplier D/A converter circuit.

FIG. 15 shows characteristics of the error $e_{stage}$ of the MDAC used in this pipelined A/D converter circuit. This $e_{stage}$ contains both the finite gain error and the settling error. Although the error $e_{stage}$ has a large value of not smaller than 1.5%, the error $e_{stage}$ of the MDAC is allowed to have sufficient linearity according to the digital error correction circuit of the present preferred embodiment.

Figure 16:
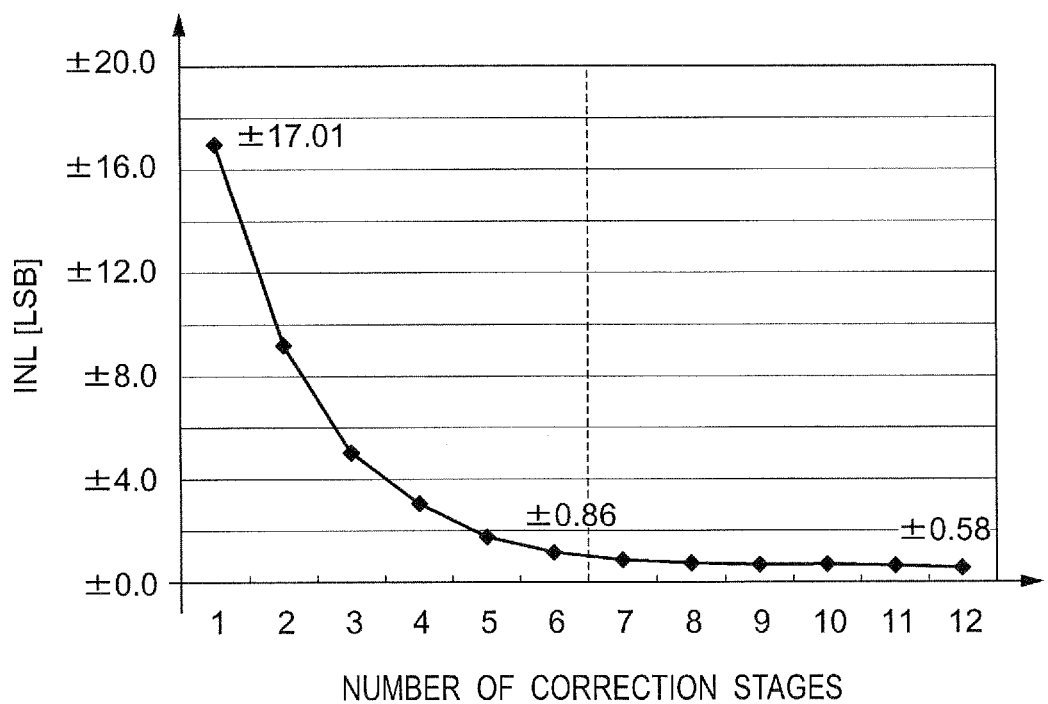
FIG. 16 is a graph showing a relation between the number of correction stages and the integral non-linearity in the digital error correction circuit.

FIG. 16 shows a relation between the number of correction stages that is the number of stages to be corrected and the integral non-linearity. As shown in FIG. 16, the integral non-linearity can be further reduced as the number of correction stages is increased. Although the integral non-linearity is about ±17 LSB when the number of correction stages is one, INL can be suppressed within ±1 LSB by performing corrections of seven stages or more by the digital error correction circuit.

As described above, according to the pipelined A/D converter circuit of the present preferred embodiment, the precharge circuit performs charging with the intermediate voltage value between the positive reference voltage and the negative reference voltage before the input signal is sampled in the sampling capacitors. Therefore, the settling error can be linearized by a simple circuit configuration, and a high-speed pipelined A/D converter circuit of small power consumption can be obtained.

Moreover, according to the pipelined A/D converter circuit of the present preferred embodiment, by connecting in series the sampling capacitors used for sampling, holding and amplification between the positive reference voltage source and the negative reference voltage source, and thereafter changing the connection of the plurality of sampling capacitors to the parallel connection by means of the second control switch, the capacitors can also be used for generating the voltage for charging. Accordingly, there is no need to separately provide a voltage generator circuit for the charging, and the mounting area of the circuit can be suppressed small.

Moreover, according to the pipelined A/D converter circuit of the present preferred embodiment, the five-value output signals of $-2V_r/3$, $-V_r/3$, 0, $V_r/3$ and $2V_r/3$ are outputted based on the comparison result signals from the five comparators having threshold values of $-V_r/2$, $-V_r/4$, 0, $+V_r/4$ and $+V_r/2$ respectively, or the three comparators having threshold values of $-V_r/4$, 0 and $+V_r/4$, respectively. Therefore, the intermediate voltage value used for the charging in the precharge circuit is generated in accordance with the input voltage to the A/D converter circuit part, and the settling error can be made more linear, allowing the high-speed pipelined A/D converter circuit of a small power consumption to be obtained.

Moreover, according to the pipelined A/D converter circuit having the digital error correction circuit of the present preferred embodiment, the linearized settling error can be corrected by the digital error correction circuit. Therefore, a high-speed pipelined A/D converter circuit that has a small power consumption and high conversion accuracy can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A pipelined A/D converter circuit, comprising:
a sample hold circuit configured to sample and hold an analog input signal, and thereafter, output a sample hold signal; and
an A/D converter circuit configured to include a plurality of A/D converter circuit parts that are connected to each other in cascade as plural stages, and perform A/D conversion in a pipelined form,
wherein the A/D converter circuit part of each stage comprises:
a sub-A/D converter circuit configured to include a plurality of comparators, and A/D convert the input signal into a digital signal of predetermined bits;
a multiplier D/A converter circuit configured to D/A convert the digital signal from the sub-A/D converter circuit into an analog control signal generated with a reference voltage served as a reference value, sample, hold and amplify the input signal with a plurality of sampling capacitors based on the analog control signal; and
a precharge circuit configured to charge the sampling capacitor on a rear stage side with an intermediate voltage value between an upper limit and a lower limit of the reference voltage in accordance with comparison result signals outputted from the plurality of comparators included in the sub-A/D converter circuit before the sampling is performed in the multiplier D/A converter circuit on the rear stage side,
wherein the precharge circuit comprises:
a first control switch configured to connect the plurality of sampling capacitors in series as a plurality of combined capacitances between a positive reference voltage source and a negative reference voltage source; and
a second control switch configured to connect the plurality of sampling capacitors in parallel between the positive reference voltage source and the negative reference voltage source, and
wherein the charging is performed by connecting in series the plurality of sampling capacitors in series as a plurality of combined capacitances by means of the first control switch between the positive reference voltage source and the negative reference voltage source, and thereafter changing connection of the plurality of sampling capacitors to parallel connection by means of the second control switch.

2. The pipelined A/D converter circuit as claimed in claim 1,
wherein the sub-A/D converter circuit, that is included in the A/D converter circuit part of a first stage among the A/D converter circuit parts, comprises five comparators having threshold values of $-V_r/2$, $-V_r/4$, 0, $+V_r/4$ and $+V_r/2$, respectively, with a reference value $V_r$ of A/D conversion of each of the A/D converter circuit parts,
wherein the sub-A/D converter circuit, that is included in the A/D converter circuit part of each stage other than the first stage among the A/D converter circuit parts, comprises three comparators having threshold values of $-V_r/4$, 0 and $+V_r/4$, respectively, and
wherein the precharge circuit outputs five-value output signals of $-2V_r/3$, $-V_r/3$, 0, $V_r/3$ and $2V_r/3$ based on comparison result signals from the comparators.

3. The pipelined A/D converter circuit as claimed in claim 1,
wherein each of the sub-A/D converter circuits comprises five comparators having threshold values of $-V_r/2$, $-V_r/4$, 0, $+V_r/4$ and $+V_r/2$, respectively, with a reference value $V_r$ of A/D conversion of each of the A/D converter circuit parts, and
wherein the precharge circuit outputs five-value output signals of $-2V_r/3$, $-V_r/3$, 0, $V_r/3$ and $2V_r/3$ based on comparison result signals from the five comparators.

4. The pipelined A/D converter circuit as claimed in claim 1, further comprising a digital error correction circuit including error correction circuits of a plurality of stages that are connected to each other in cascade,
wherein the error correction circuit of the first stage among the error correction circuits corrects the input signal outputted from each respective A/D converter circuit part located in the rear stages of the A/D converter circuit parts by using a digital signal outputted from the sub-A/D converter circuit included in the respective A/D converter circuit part and a comparison result signal outputted from the comparator included in the sub-A/D converter circuit included in the respective A/D converter circuit part, and
wherein the error correction circuits of stages other than the first stage among the error correction circuits correct the input signal outputted from the respective A/D converter circuit part by using a digital signal outputted from the sub-A/D converter circuit included in the respective A/D converter circuit part, a comparison result signal outputted from the comparator included in the sub-A/D converter circuit included in the respective A/D converter circuit part, and the input signal corrected by the error correction circuits of the other stages.

* * * * *